(12) United States Patent (10) Patent No.: US 12,652,957 B2

Uchida et al. (45) Date of Patent: Jun. 9, 2026

(54) THERMOELECTRIC BODY, THERMOELECTRIC GENERATION ELEMENT, MULTILAYER THERMOELECTRIC BODY, MULTILAYER THERMOELECTRIC GENERATION ELEMENT, THERMOELECTRIC GENERATOR, AND HEAT FLOW SENSOR

(71) Applicant: NATIONAL INSTITUTE FOR MATERIALS SCIENCE, Tsukuba (JP)

(72) Inventors: Kenichi Uchida, Tsukuba (JP); Rajkumar Modak, Tsukuba (JP); Yuya Sakuraba, Tsukuba (JP); Weinan Zhou, Tsukuba (JP); Hossein Sepehri Amin, Tsukuba (JP)

(73) Assignee: National Institute for Materials Science, Tsukuba (JP)

( * ) Notice: Subject to any disclaimer, the term of this patent is extended or adjusted under 35 U.S.C. 154(b) by 0 days.

(21) Appl. No.: 18/695,245

(22) PCT Filed: Sep. 29, 2022

(86) PCT No.: PCT/JP2022/036432

§ 371 (c)(1),
(2) Date: Mar. 25, 2024

(87) PCT Pub. No.: WO2023/054583

PCT Pub. Date: Apr. 6, 2023

(65) Prior Publication Data

US 2024/0284798 A1 Aug. 22, 2024

(30) Foreign Application Priority Data

Sep. 30, 2021 (JP) ................................. 2021-160834

(51) Int. Cl.
H10N 15/00 (2023.01)
G01K 7/04 (2006.01)

(52) U.S. Cl.
CPC ............... H10N 15/00 (2023.02); G01K 7/04 (2013.01)

(58) Field of Classification Search
CPC ....................................................... H10N 15/00
See application file for complete search history.

(56) References Cited

U.S. PATENT DOCUMENTS 4,287,225 A * 9/1981 Kneller .................. G11B 5/656
427/295
2008/0236441 A1* 10/2008 Nobe ...................... C25D 5/617
205/238

(Continued)

FOREIGN PATENT DOCUMENTS

JP 2018-190780 A 11/2018
JP 2021-40066 A 3/2021

(Continued)

OTHER PUBLICATIONS

Kitaura (Year: 2021).*
Liu (Year: 2006).*
Lu (Year: 2010).*
Akhtar (Year: 2020).*
Lee (Year: 1983).*
Legrand (Year: 1998).*
Rhen (Year: 2015).*

(Continued)

*Primary Examiner* — Sadie White
(74) *Attorney, Agent, or Firm* — SALIWANCHIK, LLOYD & EISENSCHENK

(57) ABSTRACT

[Object] To provide a thermoelectric body that can be deposited on any substrate, which is not limited to a single crystal bulk material or an epitaxially grown thin film, and is capable of exhibiting high coercive force and residual magnetization with respect to in-plane magnetization.
[Solving Means] A thermoelectric body that is a magnetic film for use in a thermoelectric generation element utilizing an anomalous Nernst effect, characterized by having an easy axis of magnetization in an in-plane direction and an amorphous structure. Favorably, the thermoelectric body is characterized in that $Sm_pCo_{100-p}$ $(0<p\leq50)$ or $Sm_p(Fe_qCo_{100-q})_{100-p}$ $(0<p\leq50, 0\leq q\leq100)$ is included.

12 Claims, 18 Drawing Sheets

(56) References Cited

U.S. PATENT DOCUMENTS

| | | | |
|---|---|---|---|
| 2012/0024333 A1* | 2/2012 | Lee | C04B 35/645 |
| | | | 264/28 |
| 2012/0153212 A1* | 6/2012 | Liu | B22F 9/04 |
| | | | 977/773 |
| 2014/0311542 A1* | 10/2014 | Yuasa | H10N 15/00 |
| | | | 136/205 |
| 2016/0155919 A1 | 6/2016 | Kinoshita et al. | |
| 2020/0037884 A1 | 2/2020 | Ishida et al. | |
| 2020/0313062 A1 | 10/2020 | Iwasaki et al. | |
| 2022/0246820 A1 | 8/2022 | Nakatsuji et al. | |
| 2023/0102920 A1* | 3/2023 | Sakuraba | H10N 10/17 |

FOREIGN PATENT DOCUMENTS

| | | |
|---|---|---|
| WO | 2018/180800 A1 | 10/2018 |
| WO | 2019/064972 A1 | 4/2019 |
| WO | 2020/218613 A1 | 10/2020 |

OTHER PUBLICATIONS

International Search Report dated Dec. 13, 2022 in International Application No. PCT/JP2022/036432.

Sakuraba, Y., "Grasp heat flow with magnetic materials: Progress and Prospects of Heat Flow Sensor Research Using the Anomalous Nernst Effect," 2021, Metals, 91(7):1-21.

Ohashi, K., "Present and Future of Sm2Co17 Magnets," J. Japan Inst. Metals, 2012, 76(1):1-41.

Miura, A. et al., "Observation of anomalous Ettingshausen effect and large transverse thermoelectric conductivity in permanent magnets," Applied Physics Letters, Nov. 26, 2019, 115:1-6.

Miura, A. et al., "High-temperature dependence of anomalous Ettingshausen effect in SmCo5-type permanent magnets," Applied Physics Letters, Aug. 27, 2020, 117:1-7.

Office Action dated Jan. 7, 2025 in Japanese Application No. 2023-551845.

* cited by examiner (a)

(b)

Top view

Side view (c)

(d)

(a)

(b)

(c)

(d)

(c)

(d)

(a)

(b)

(c)

(d)

(a)

(b)

THERMOELECTRIC BODY, THERMOELECTRIC GENERATION ELEMENT, MULTILAYER THERMOELECTRIC BODY, MULTILAYER THERMOELECTRIC GENERATION ELEMENT, THERMOELECTRIC GENERATOR, AND HEAT FLOW SENSOR

CROSS-REFERENCE TO RELATED APPLICATIONS

This application is the U.S. national stage application of International Patent Application No. PCT/JP2022/036432, filed Sep. 29, 2022, which claims the benefit under 35 U.S.C. § 119 of Japanese Application No. 2021-160834, filed Sep. 30, 2021, the disclosures of each of which are incorporated herein by reference in their entirety.

TECHNICAL FIELD

The present invention relates to thermoelectric bodies and multilayer thermoelectric bodies that are magnetic bodies and are used in thermoelectric power generation elements that utilize the anomalous Nernst effect.

BACKGROUND ART

The anomalous Nernst effect that occurs in ferromagnetic materials is a phenomenon in which an electric field is generated in a direction perpendicular to heat flow and magnetization. Since the Seebeck effect that has been studied as a thermoelectric generation technology is a phenomenon in which heat flow and an electric field appear in the same direction, in order to convert thermal energy from a heat source into electrical energy, it is necessary to create a complex structure in which p-type semiconductors and n-type semiconductors are alternately connected in series and arranged in a matrix.

Meanwhile, by using the anomalous Nernst effect for thermoelectric power generation, thermoelectric conversion is possible with an extremely simple structure in which magnetic wires extend in the in-plane direction of the heat source because an electric field is generated in the in-plane direction for the heat flow flowing out of the plane. Therefore, in accordance with thermoelectric power generation utilizing an anomalous Nernst effect, for example, it is possible to achieve advantages such as ease of application to a heat source having a non-flat shape such as a cylindrical shape and cost reduction of elements.

As such a technology relating to a thermoelectric generation element, Non-Patent Literature 1 describes the technical development of a heat flow sensor utilizing the anomalous Nernst effect. Further, some of the present inventors have proposed novel thermoelectric conversion materials in Patent Literatures 1 to 3.

Non-Patent Literature 2 describes a crystal structure and magnetic properties of an SmCo alloy as a rare earth magnet regarding various composition ratios in detail. However, there is no mention of the anomalous Nernst effect. Non-Patent Literatures 3 and 4 written by some of the present inventors have reported study on the anomalous Nernst effect in an SmCo5 magnet, but do not include reports on amorphous.

CITATION LIST

Patent Literature

Patent Literature 1: Japanese Patent Application Laid-open No. 2016-103535

Patent Literature 2: Japanese Patent Application Laid-open No. 2018-190780

Patent Literature 3: Japanese Patent Application Laid-open No. 2021-040066

Non-Patent Literature

Non-Patent Literature 1: Yuya Sakuraba, "Exploration of magnetic materials for energy harvesting based on anomalous Nernst effect", Kinzoku, Vol. 91, No. 7, pp 573 to 580 (2021)

Non-Patent Literature 2: Oen Ohashi, "Present and Future of $Sm_2Co_{17}$ magnets", J. JapanInst. Metals, Vol. 76, No. 1 pp. 96 to 106 (2012)

Non-Patent Literature 3: A. Miura, et al.: "Observation of anomalous Ettingshausen effect and large transverse thermoelectric conductivity in permanent magnets": Applied Physics Letters 115, 222403 (2019).

Non-Patent Literature 4: A. Miura, et al.: "High-temperature dependence of anomalous Ettingshausen effect in SmCo5-type permanent magnets": Applied Physics Letters 117, 082408 (2020).

DISCLOSURE OF INVENTION

Technical Problem

However, in existing thermoelectric conversion materials utilizing the anomalous Nernst effect, high anomalous Nernst coefficients have been obtained only in single crystal bulk materials, epitaxially grown thin films, and crystalline materials that require high-temperature heat treatment, resulting in poor versatility.

Further, existing thermoelectric conversion materials utilizing the anomalous Nernst effect have a problem in that application of an external magnetic field is necessary for the operation of the anomalous Nernst effect because the coercive force and the ratio of residual magnetization to saturation magnetization are small except for bulk permanent magnets.

Therefore, in order to realize thermoelectric applications utilizing the anomalous Nernst effect, a thin film that can be deposited on any substrate, which is not limited to a single crystal bulk material or an epitaxially grown thin film, and has a high anomalous Nernst coefficient, high coercive force, and residual magnetization with respect to saturation magnetization is necessary.

In this regard, an object of the present invention is to provide a thermoelectric body that can be deposited on any substrate and is capable of exhibiting high coercive force with respect to in-plane magnetization and a high ratio of residual magnetization to saturation magnetization.

Further, an object of the present invention is to provide a multilayer thermoelectric body capable of generating a voltage by a large anomalous Nernst effect without applying an external magnetic field to the existing ferromagnetic material, by means of using a stacked structure of a rare earth intermetallic amorphous magnetic alloy material with an in-plane easy magnetization direction having large coercive force and residual magnetization; and another ferromagnetic material having a huge anomalous Nernst effect.

Solution to Problem

[1] A thermoelectric body according to the present invention is a thermoelectric body that is a magnetic film for use in a thermoelectric generation element utilizing an anomalous Nernst effect, characterized by having an easy axis of magnetization in an in-plane direction and an amorphous structure.

[2] The thermoelectric body according to [1] of the present invention is characterized in that $Sm_pCo_{100-p}$ ($0<p\leq50$) is favorably included.

[3] In the thermoelectric body according to [2] of the present invention, a relationship of $15\leq p\leq35$ may favorably be satisfied, and a relationship of $20\leq p\leq30$ may more favorably be satisfied.

[4] The thermoelectric body according to [1] of the present invention is characterized in that $Sm_p(Fe_qCo_{100-q})_{100-p}$ ($0<p\leq50$, $0\leq q\leq100$) is favorably included.

[5] The thermoelectric body according to [4] of the present invention is characterized in that relationships of $15\leq p\leq35$ and $5\leq q\leq45$ are favorably satisfied and relationships of $20\leq p\leq30$ and $10\leq q\leq35$ are more favorably satisfied.

[6] A thermoelectric generation element according to the present invention may include: the thermoelectric body according to any one of [1] to [5] of the present invention; and a substrate that supports the thermoelectric body.

[7] A multilayer thermoelectric body according to the present invention has a stacked structure of a first magnetic material layer that has an easy axis of magnetization exhibiting large coercive force and a large ratio of residual magnetization to saturation magnetization in an in-plane direction, exhibits a large anomalous Nernst effect, and is formed of a rare earth intermetallic amorphous magnetic alloy, and a second magnetic material layer that exhibits a huge anomalous Nernst effect and is formed of a magnetic material different from the rare earth intermetallic amorphous magnetic alloy material.

[8] In the multilayer thermoelectric body according to [7] of the present invention, favorably, the large coercive force may be coercive force 10 mT or more, the large ratio of residual magnetization to saturation magnetization may be 0.3 or more, the large anomalous Nernst effect may be thermoelectric power of 1 μV/K or more, and the huge anomalous Nernst effect may be thermoelectric power of 5 μV/K or more.

[9] The multilayer thermoelectric generation element according to the present invention may include: the multilayer thermoelectric body according to [7] or [8] of the present invention; and a substrate that supports the thermoelectric body.

[10] A bendable thermoelectric generator may use the thermoelectric generation element according to any one of [1] to [6] of the present invention or the multilayer thermoelectric generation element according to any one of [7] to [9].

[11] A bendable heat flow sensor may use the thermoelectric generation element according to any one of [1] to [6] of the present invention or the multilayer thermoelectric generation element according to any one of [7] to [9].

Advantageous Effects of Invention

The thermoelectric generation element according to the present invention is useful for application of the transverse thermoelectric effect to real life by applying rare earth intermetallic amorphous magnetic alloys to transverse thermoelectric conversion that operates without an external magnetic field.

The multilayer thermoelectric generation element according to the present invention is capable of realizing, by using a stacked structure of a rare earth intermetallic amorphous magnetic alloy material with an in-plane easy magnetization direction having large coercive force and residual magnetization and exhibiting a large anomalous Nernst effect and another ferromagnetic material having a huge anomalous Nernst effect, a large anomalous Nernst effect without applying an external magnetic field to the existing ferromagnetic material.

BRIEF DESCRIPTION OF DRAWINGS

FIG. 1 is a configuration diagram showing a typical anomalous Nernst thermopile structure for thermoelectric conversion that generates an electromotive force in a perpendicular direction with respect to a heat flow direction, showing an embodiment of the present invention.

FIG. 2A shows a deposition example for examining the optimal composition ratio of a rare earth intermetallic amorphous magnetic alloy showing an embodiment of the present invention, and is a plan view schematically showing a structure of an amorphous $Sm_pCo_{100-p}$ ($0\leq p\leq100$) gradient-composition film.

FIG. 2B shows a deposition example for examining the optimal composition ratio of a rare earth intermetallic amorphous magnetic alloy showing an embodiment of the present invention, and is a cross-sectional view schematically showing the structure of the amorphous $Sm_pCo_{100-p}$ ($0\leq p\leq100$) gradient-composition film.

FIG. 2C is a diagram showing an XRD pattern of the amorphous $Sm_pCo_{100-p}$ ($0\leq p\leq100$) gradient-composition film at different p values.

FIG. 2D shows a cross-sectional bright field (BF)-STEM image and a microbeam electron diffraction pattern of a region where the Sm composition ratio is high on the right side shown by (A) in FIG. 2A.

FIG. 2E shows a cross-sectional bright field (BF)-STEM image and a microbeam electron diffraction pattern of a region where the Co and Sm composition ratios are roughly equal near the approximate center shown by (B) in FIG. 2A.

FIG. 2F shows a cross-sectional bright field (BF)-STEM image and an a microbeam electron diffraction pattern of a region where the Co composition ratio is high on the left side shown by (C) in FIG. 2A.

FIG. 3 is a graph showing the composition dependence of a temperature change per unit current density due to the anomalous Ettingshausen effect (reciprocal phenomenon of the anomalous Nernst effect) in the amorphous $Sm_pCo_{100-p}$ ($0\leq p\leq100$) gradient-composition film on an MgO substrate.

Part (b) shows the magnetic field dependence curve (black symbol) of in-plane magnetization of the deposited amorphous $Sm_{20}Co_{80}$ film.

Part (c) shows the external magnetic field dependence of the ANE electric field when the heat output is changed.

Part (d) shows the temperature gradient dependence of the ANE electric field.

[Fig. 5] Part (a) of FIG. 5 is a diagram showing a schematic structure of a thermopile for heat flux detection using an amorphous $Sm_{20}Co_{80}$ thin film.

Part (b) is a diagram showing a schematic experimental apparatus for heat flux sensing.

Part (c) is a diagram showing observation results of the ANE voltage signal using the above experimental configuration of an amorphous $Sm_{20}Co_{80}$ film deposited on a polyethylene naphthalate (PEN) substrate, and the horizontal axis indicates a strength H of the magnetic field.

Part (d) is similar to Part (c), and the horizontal axis indicates heat flow density $J_Q$ in a direction perpendicular to the sample plane.

[Fig. 6] Part (a) of FIG. 6 is a cross-sectional view schematically showing a structure of an amorphous $Sm_{20}$ $(Fe_qCo_{100-q})_{80}$ ($0 \leq q \leq 100$) gradient-composition film.

Part (b) is a diagram showing an XRD pattern at different q values in Part (a) of FIG. 6.

Part (c) shows a cross-sectional bright field (BF)-STEM image and a microbeam electron diffraction pattern for checking the results obtained by XRD.

Part (d) shows a microbeam electron diffraction pattern for checking the results obtained by XRD shown in Part (b) of FIG. 6.

Figure 7:
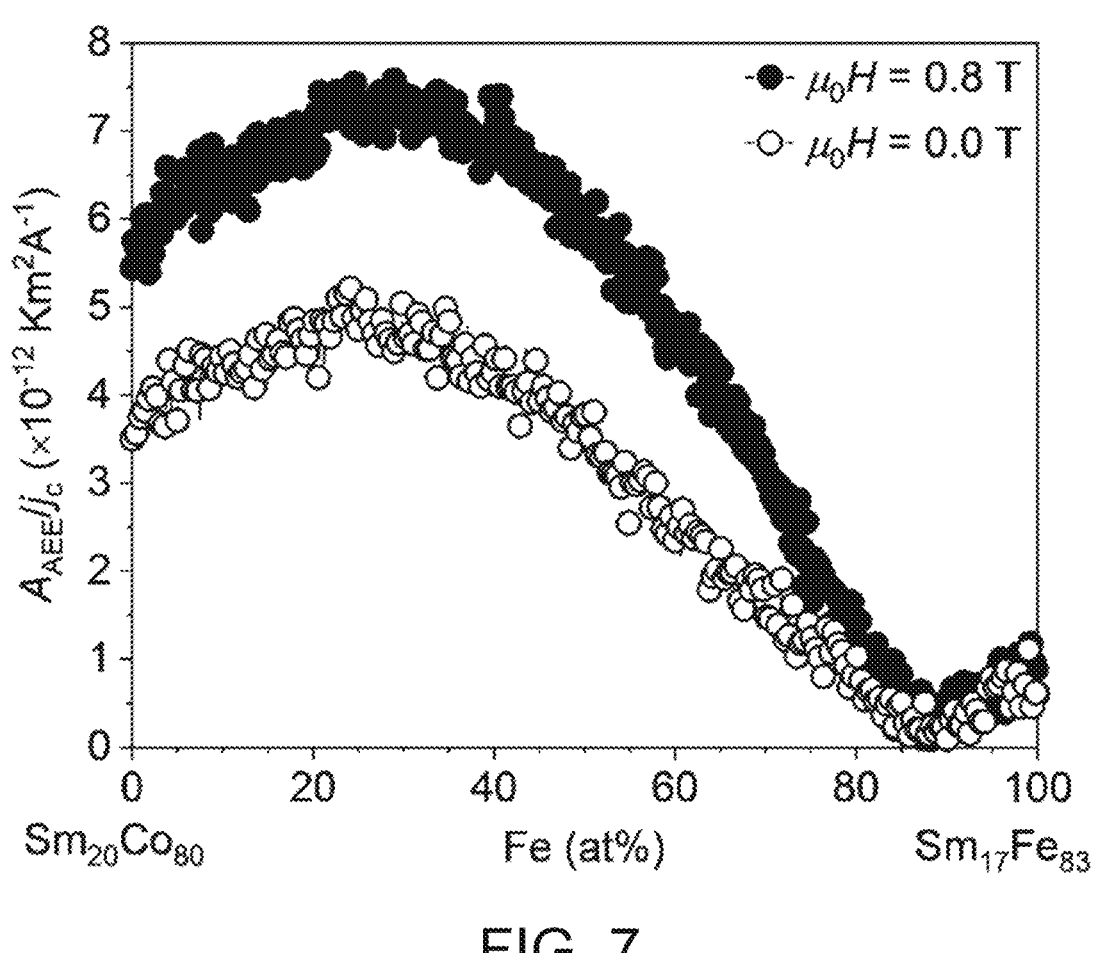

[Fig. 7] FIG. 7 shows the composition dependence of a temperature change per unit current density by the anomalous Ettingshausen effect in an amorphous $Sm_{20}(Fe_q Co_{100-q})_{80}$ ($0 \leq q \leq 100$) gradient-composition film on an MgO substrate.

[Fig. 8] Part (a) of FIG. 8 is a schematic diagram of a process of producing an amorphous $Sm_{20}(Fe_{23}Co_{77})_{80}$ film.

Part (b) shows the magnetic field dependence curve of in-plane magnetization of the deposited an $Sm_{20}(Fe_{23} Co_{77})_{80}$ film, Part (c) shows the external magnetic field dependence of the ANE electric field when the heat output is changed, and Part (d) shows the temperature gradient dependence of the ANE electric field.

[Fig. 9] FIG. 9 shows a schematic multilayer thermopile structure using a rare earth intermetallic amorphous magnetic alloy and a magnetic material that is different from this and has a huge anomalous Nernst effect, showing a multilayer thermopile structure according to the present invention.

MODE(S) FOR CARRYING OUT THE INVENTION

Definitions of technical terms used in the present specification are as follows.

The "thermoelectric conversion material" is a substance capable of converting heat into electricity, is used in, for example, a power generation module or a temperature control element, and is useful for producing environmentally friendly energy and further increasing the efficiency of energy saving.

The "Nernst effect" is a phenomenon reported by E. Nernst et al. in 1886, and is a phenomenon in which when an external magnetic field H is applied to a conductive substance subjected to a temperature gradient $\nabla T$, an electric field is generated in the cross product direction of H and $\nabla T$ (see Non-Patent Literature 1).

The "anomalous Nernst effect" is a phenomenon unique to magnetic materials, and is a phenomenon in which an electric field is generated in the cross-product direction of magnetization M of the magnetic material and the temperature gradient $\nabla T$ without applying an external magnetic field (see Non-Patent Literature 1). Hereinafter, the anomalous Nernst effect will be abbreviated as anomalous Nernst effect (ANE) in some cases.

A "thermopile" is a structure in which multiple thermoelectric conversion materials are connected in series or in parallel, and is used to boost the thermoelectromotive force.

First Embodiment

Embodiments of the present invention will be described below with reference to the drawings.

Figure 1A:
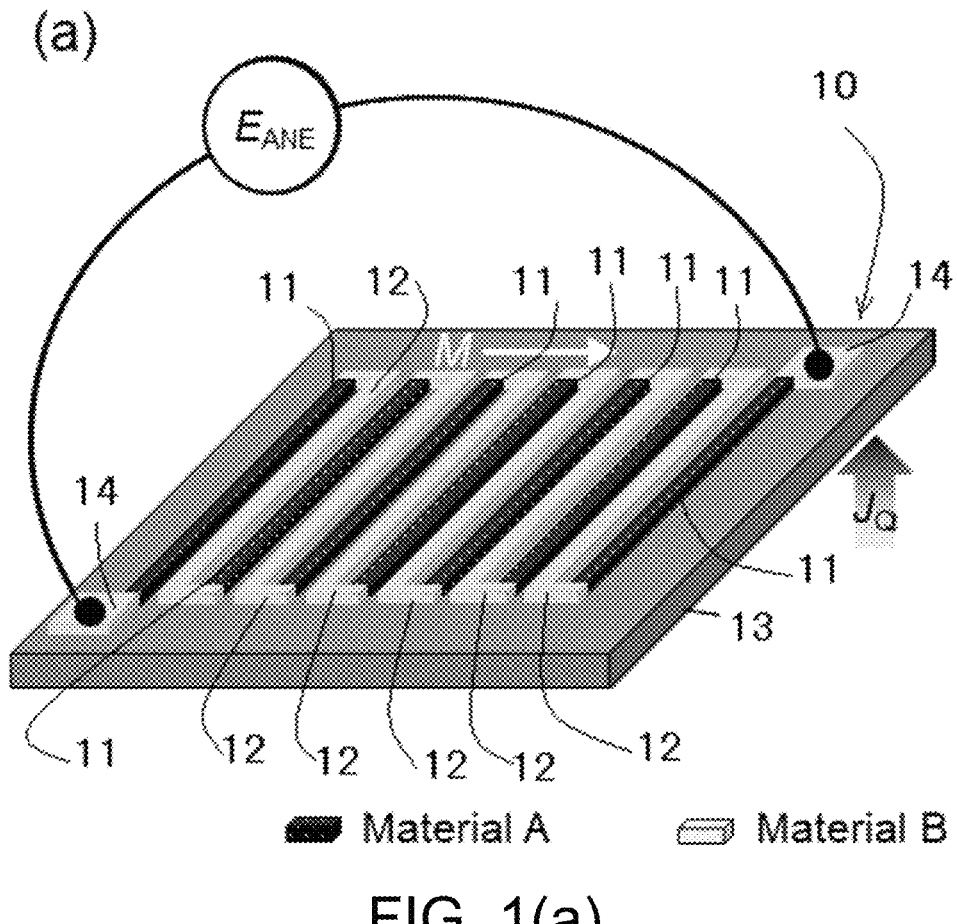
[Fig. 1]
Figure 1B:
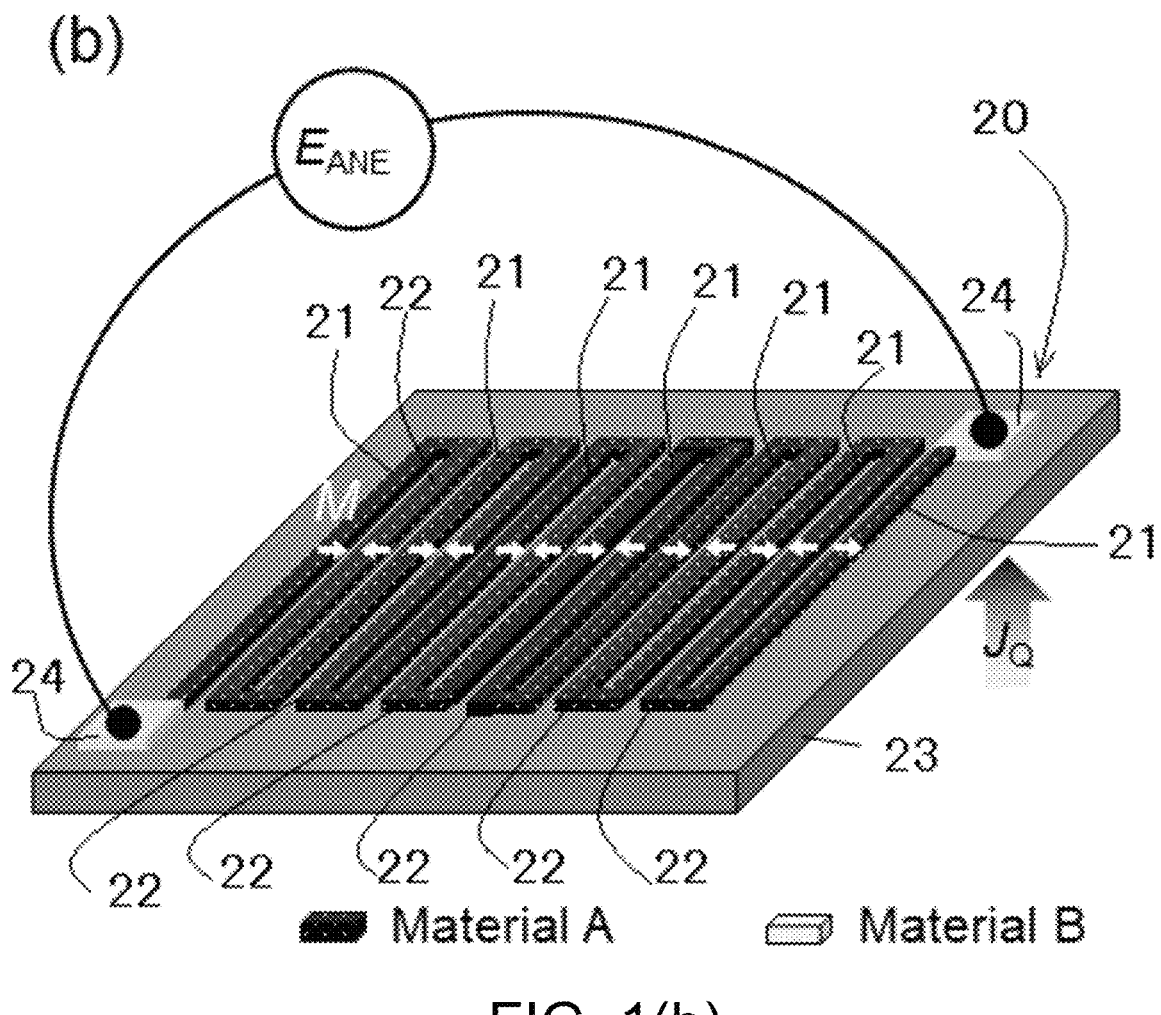

FIGS. 1(a) and 1(b) are diagrams describing a typical Nernst thermopile structure for transverse thermoelectric conversion in which input heat flow and an output current are orthogonal to each other. FIG. 1(a) shows a case where the direction of the magnetization M is uniform with respect to the substrate, and FIG. 1(b) shows the case where the direction of magnetization M alternates between rightward and leftward directions between adjacent thermoelectric bodies.

The thermoelectric body according to the present invention is a magnetic film for use in a thermoelectric generation element utilizing an anomalous Nernst effect. A thermoelectric body 11 according to the present invention is characterized by having an easy axis of magnetization in an in-plane direction and an amorphous structure. By using this, it is possible to obtain a transverse thermoelectric conversion element that is free from an external magnetic field and is capable of generating an electromotive force in the in-plane direction.

[Thermoelectric Generation Element 10]

FIG. 1(a) is a diagram describing a thermoelectric generation element 10 using a thermoelectric conversion material according to the present invention. The thermoelectric generation element 10 shown in FIG. 1(a) includes a substrate 13, the thermoelectric body 11 and a connector 12 arranged (supported) on this substrate 13, and a connection terminal 14. In FIG. 1(a), the material of the thermoelectric body 11 is indicated as a Material A and the material of the connector 12 is indicated as a Material B.

The thermoelectric body 11 typically includes a rare earth intermetallic amorphous magnetic alloy film (magnetic film) such as an amorphous $Sm_{20}Co_{80}$ thin film. The rare earth intermetallic amorphous magnetic alloy film has strong magnetic anisotropy in the in-plane direction and has easy axis of magnetization in the in-plane direction. For this reason, the rare earth intermetallic amorphous magnetic alloy film exhibits large coercive force and large residual magnetization with respect to saturation magnetization, and maintains magnetization even if an external magnetic field is applied and then the magnetic field is returned to a zero magnetic field. The magnetization direction of the rare earth intermetallic amorphous magnetic alloy faces the direction of the applied external magnetic field and can be controlled in an arbitrary direction, which is suitable for controlling the output of the anomalous Nernst effect. As the material forming the thermoelectric body 11 (Material A), the rare earth intermetallic amorphous magnetic alloy favorably includes $Sm_pCo_{100-p}$ ($0<p\leq50$) or $Sm_p(Fe_qCo_{100-q})_{100-p}$ ($0<p\leq50$, $0\leq q\leq100$), more favorably includes $Sm_pCo_{100-p}$ ($15\leq p\leq35$) or $Sm_p(Fe_qCo_{100-q})_{100-p}$ ($15\leq p\leq50$, $5\leq q\leq45$), and still more favorably includes $Sm_pCo_{100-p}$ ($20\leq p\leq30$) or $Sm_p$ $(Fe_qCo_{100-q})_{100-p}$ ($20\leq p\leq30$, $10\leq q\leq35$).

Further, the thermoelectric body 11 may be a uniform alloy film or have, for example, a multilayer structure in which different types of single metal layers are alternately stacked on a nanoscale, and is not limited thereto.

Note that the thickness of the magnetic film can be, for example, approximately 10 nm to 1 μm, but is not particularly limited thereto.

The connector 12 is formed of a non-magnetic material that does not exhibit an anomalous Nernst effect (e.g., copper (Cu), chromium (Cr), gold (Au), silver (Ag), or platinum (Pt)) as the Material B. Alternatively, the connector 12 may be formed of a ferromagnetic material having an anomalous Nernst coefficient of the sign opposite to that of the thermoelectric body 11 (e.g., Fe, NdFeB, MnGa) or a ferromagnetic material $Sm_nFe_{1-n}(0 \leq n \leq 100)$ having an anomalous Nernst coefficient lower than that of the thermoelectric body 11, as the Material B.

The substrate 13 is formed of MgO, Si—$SiO_2$, $Al_2O_3$, AlN, glass, diamond, PEN, a polyimide film (Kapton (registered trademark of DuPont)), a polymer, or the like.

The connection terminals 14 are formed of the same material as that of the connector 12 (Material B) here, and are provided at both ends of the thermoelectric body 11. Note that the connection terminal 14 may be formed of the same material as that of the thermoelectric body 11 (Material A), and the arrangement of the thermoelectric body 11 and the connector 12 may be exchanged in FIGS. 1(*a*) and 1(*b*).

The thermoelectric body 11 is formed by making a rare earth intermetallic amorphous magnetic alloy film such as an amorphous $Sm_{20}Co_{80}$ thin film deposited on the substrate 13 into a thin wire, and is magnetized in a direction M shown in FIG. 1(*a*). The thermoelectric body 11 is configured to generate electricity in the direction of the electric field shown in FIG. 1(*a*) (longitudinal direction of the thermoelectric body 11 and the connector 12) with respect to the temperature difference in the direction (direction $J_Q$ of heat flow shown in FIG. 1(*a*)) perpendicular to the direction of the magnetization M by the anomalous Nernst effect.

The connectors 12 are arranged on the surface of the substrate 13 in parallel to the thermoelectric bodies 11, 11, . . . . One connector 12 is arranged between a pair of thermoelectric bodies 11, 11 adjacent to each other, and the connector 12 electrically connects one end side of one thermoelectric body 11 and the other end side of the other thermoelectric body 11. As a result, the thermoelectric bodies 11 are electrically connected in series by the connectors 12.

As described above, the thermoelectric generation element 10 includes the thermoelectric body 11 that includes a rare earth intermetallic amorphous magnetic alloy film such as an amorphous $Sm_{20}Co_{80}$ thin film. In accordance with the thermoelectric body 11 that includes a rare earth intermetallic amorphous magnetic alloy film such as an amorphous $Sm_{20}Co_{80}$ thin film, it is possible to increase the thermoelectromotive force by increasing the effective length in the electric field direction. Therefore, according to this embodiment, by using such a thermoelectric element 11, it is possible to provide the thermoelectric power generation element 10 in a form that is easy to put into practical use.

[Thermoelectric Generation Element 20]

FIG. 1(*b*) is a diagram describing a thermoelectric generation element 20 using a thermoelectric conversion material according to the present invention. The thermoelectric generation element 20 shown in FIG. 1(*b*) includes a substrate 23, a thermoelectric body 21 and a reverse magnetization connector 22 arranged (supported) on this substrate 23, and a connection terminal 24. In FIG. 1(*b*), the material of each of the thermoelectric body 21 and the reverse magnetization connector 22 is indicated as the Material A and the material of the connection terminal 24 is indicated as the Material B.

The thermoelectric body 21 and the reverse magnetization connector 22 each include a rare earth intermetallic amorphous magnetic alloy film such as an amorphous $Sm_{20}Co_{80}$ thin film, similarly to the above thermoelectric body 11.

Even when the thermoelectric body 21 and the reverse magnetization connector 22 are formed of the same material, by alternately arranging the thermoelectric body 21 and the reverse magnetization connector 22 having the magnetization directions M in opposite directions, the ANE electric field is boosted without canceling each other out.

The substrate 23 is formed of silicon, magnesium oxide, or the like, similarly to the above-mentioned substrate 13.

The connection terminal 24 is favorably formed of the same material as that of the connector 12 as the Material B here, and is formed of, for example, a non-magnetic material that does not exhibit an anomalous Nernst effect (e.g., copper (Cu), chromium (Cr), gold (Au), silver (Ag), or platinum (Pt)). The connection terminals 24 are provided at both ends of the thermoelectric body 21. Note that the connection terminal 24 may be formed of the same material (Material A) as those of the thermoelectric body 21 and the reverse magnetization connector 22.

The reverse magnetization connectors 22 are arranged on the surface of the substrate 23 in parallel to the thermoelectric bodies 21, 21, . . . . One reverse magnetization connector 22 is arranged between a pair of thermoelectric bodies 21, 21 adjacent to each other, and the reverse magnetization connector 22 connects one end side of one thermoelectric body 21 and the other end side of the other thermoelectric body 21. As a result, the thermoelectric bodies 21 are electrically connected in series by the reverse magnetization connectors 22.

As described above, the thermoelectric generation element 20 includes the thermoelectric body 21 and the reverse magnetization connector 22 that include a rare earth intermetallic amorphous magnetic alloy film such as an amorphous $Sm_{20}Co_{80}$ thin film. In accordance with the thermoelectric body 21 and the reverse magnetization connector 22 that include an amorphous $Sm_{20}Co_{80}$ thin film, it is possible to increase the thermoelectromotive force by increasing the effective length in the electric field direction. Therefore, in accordance with this embodiment, it is possible to provide the thermoelectric generation element 20 that is easy to put to practical use by using such a thermoelectric body 21 and a reverse magnetization connector 22.

Since the magnetic film formed of a material such as a rare earth intermetallic amorphous magnetic alloy to be used as the thermoelectric bodies 11, 21, the connector 12, and the reverse magnetization connector 22 has a strong easy axis of magnetization in the in-plane direction and exhibits high coercive force and a large ratio of residual magnetization to saturation magnetization even in a thickened or thinned shape, it is possible to exhibit a voltage by a large anomalous Nernst effect even in the zero magnetic field, individually control the magnetization direction of each wire (the thermoelectric bodies 11, 21, the connector 12, the reverse magnetization connector 22), and create a thermopile element using a single material. Since thickening and thinning are possible while maintaining a large ratio of residual magnetization to saturation magnetization, it is possible to increase the thermoelectric output per unit area by reducing the width of thin lines while suppressing the increase in internal electric resistance of the entire thermopile structure by the thickening. The magnetization of each layer can also be controlled by using a local magnetic field or adding a pinning layer such as Cr and using an exchange bias effect.

Here, in order to examine the optimal composition ratio of $Sm_pCo_{100-p}$ as a rare earth intermetallic amorphous magnetic alloy, a film containing an amorphous gradient-composition material in which p of $Sm_pCo_{100-p}$ was changed from 0 to 100 was prepared (hereinafter, referred to simply also as "amorphous $Sm_pCo_{100-p}$ ($0 \leq p \leq 100$) gradient-composition film"), and the physical properties (structure and thermoelectric performance) thereof were evaluated.

(Amorphous $Sm_pCo_{100-p}$ ($0 \leq p \leq 100$) Gradient-Composition Film and its Structural Evaluation)

Figure 2A:
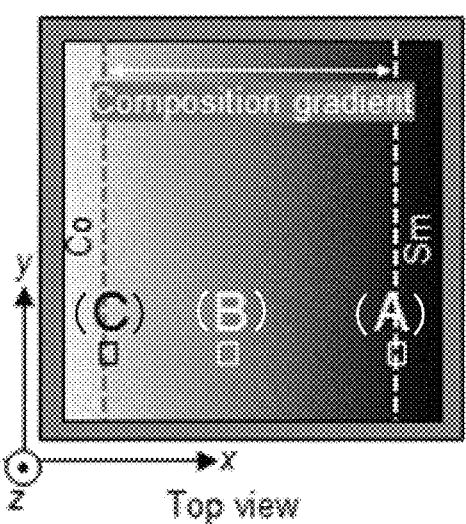
[Fig. 2A]
Figure 2B:
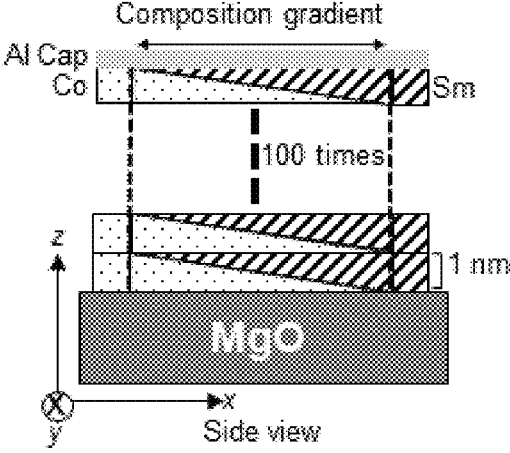
[Fig. 2B]

FIG. 2A schematically shows a structure of an amorphous $Sm_pCo_{100-p}$ ($0 \leq p \leq 100$) gradient-composition film, and is a plan view. FIG. 2B shows a cross-sectional view thereof. One hundred stacked bodies that are each formed of a gradient-composition material of Sm and Co with a total thickness of 1 nm of Sm and Co per layer are stacked on an MgO substrate, and a thin aluminum film for oxidation prevention is deposited on the top layer thereof. The stacked body having a thickness of 1 nm is a gradient-composition layer in which the Sm composition ratio increases from 0 at % to 100 at % in the x-axis direction in FIG. 2A and FIG. 2B, the right side shown by (A) in FIG. 2A is a region where the Sm composition ratio is high, the approximate center area shown by (B) in FIG. 2A is a region where the Co and Sm composition ratios are roughly equal, and the left side shown by (C) in FIG. 2A is a region where the Co composition ratio is high.

Figure 2C:
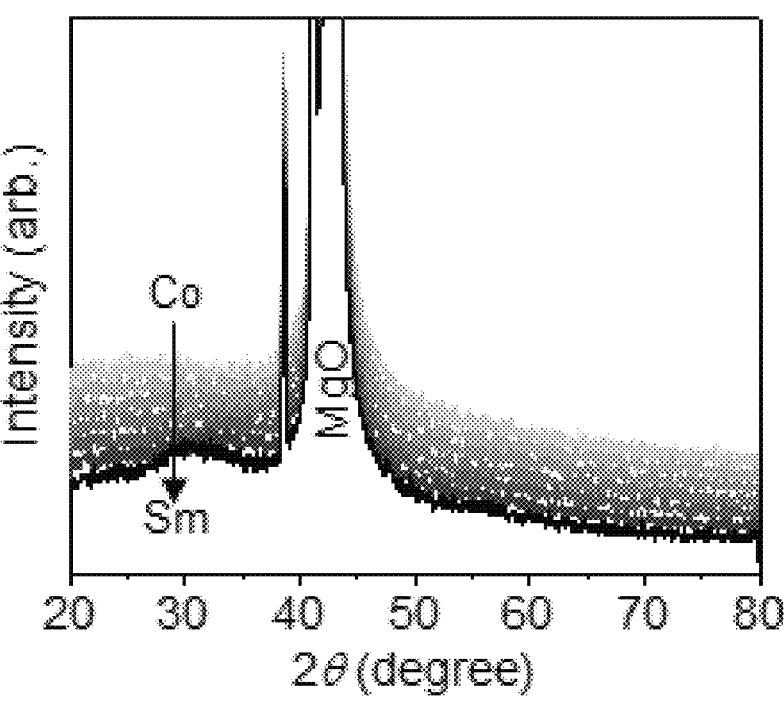
[Fig. 2C]

FIG. 2C shows an XRD pattern of an amorphous $Sm_pCo_{100-p}$ ($0 \leq p \leq 100$) gradient-composition film at different p values. The XRD pattern confirmed that most of the Sm—Co binary alloy phase was an amorphous phase except for a region where pure Sm and Co are rich.

Figure 2D:
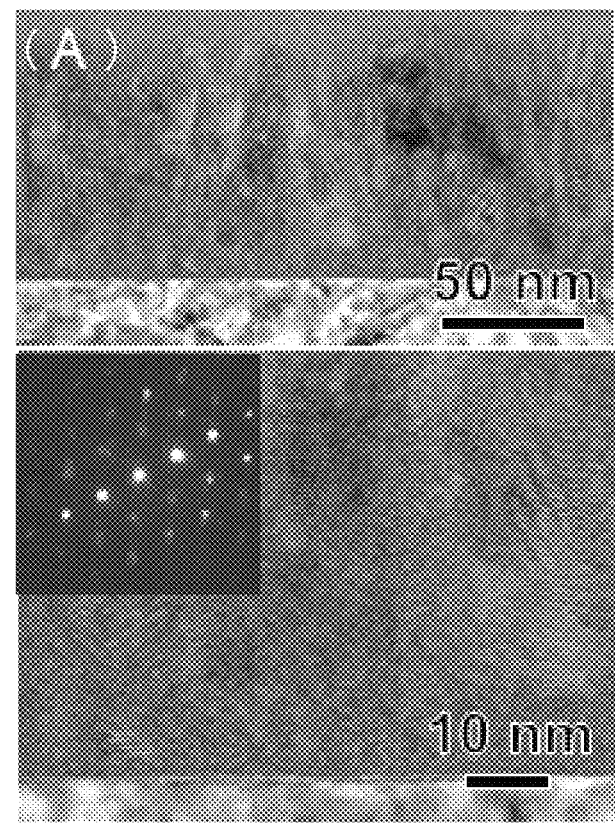
[Fig. 2D]

FIG. 2D shows a cross-sectional bright field (BF)-STEM image and a microbeam electron diffraction pattern of a region, where the Sm composition ratio is high on the right side shown by (A) in FIG. 2A. The TEM image corroborates the results obtained by XRD. In a region where Sm is rich, a diffraction image showing a crystal structure has been obtained.

Figure 2E:
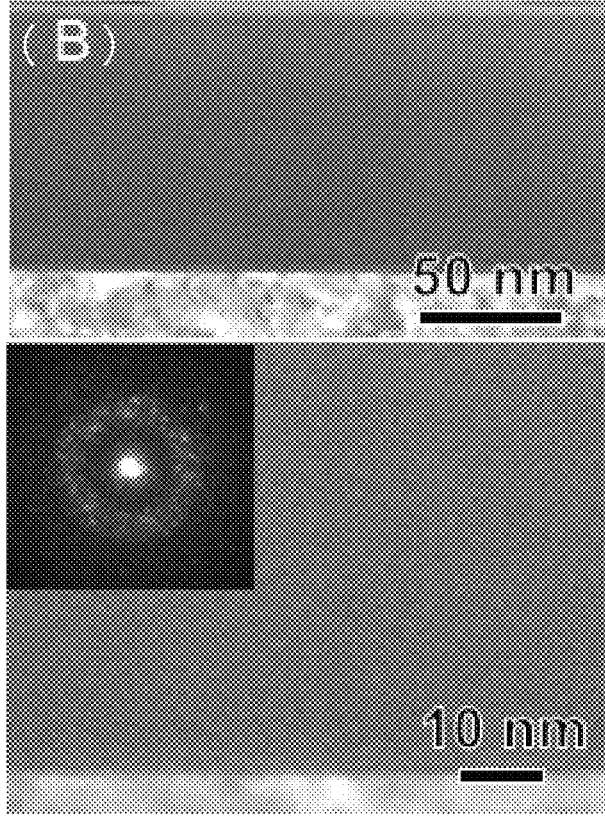
[Fig. 2E]

FIG. 2E shows a cross-sectional bright field (BF)-STEM image and a microbeam electron diffraction pattern of a region where the Co and Sm composition ratios are roughly equal near the approximate center shown by (B) in FIG. 2A. It was confirmed that most of the Sm—Co binary alloy phase was an amorphous phase.

Figure 2F:
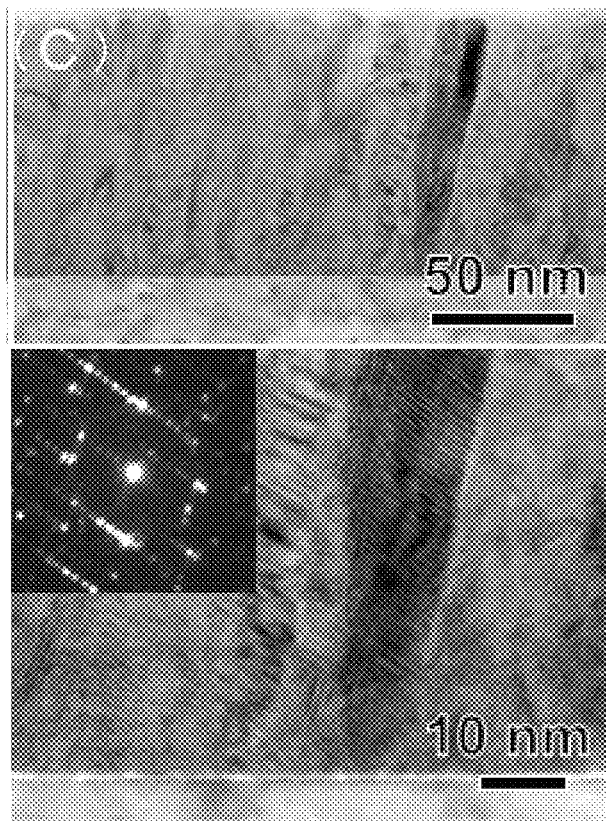
[Fig. 2F]

FIG. 2F shows a cross-sectional bright field (BF)-STEM image and a microbeam electron diffraction pattern of a region where the Co composition ratio is high on the left side shown by (C) in FIG. 2A. In a region where Co is rich, a diffraction image showing a crystal structure has been obtained.

(Amorphous $Sm_pCo_{100-p}$ ($0 \leq p \leq 100$) Gradient-Composition Film and its Thermoelectric Effect)

Figure 3:
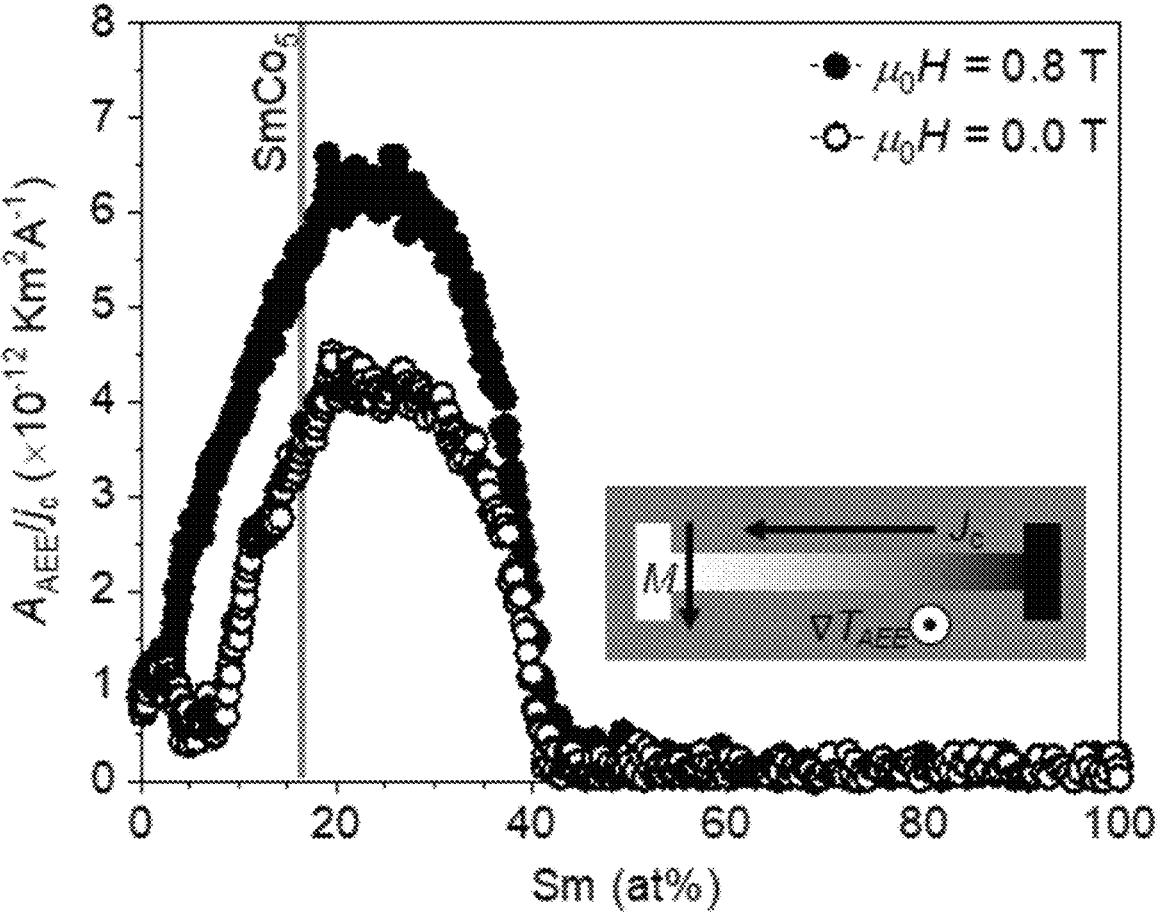
[Fig. 3]

FIG. 3 is a graph showing the composition dependence of a temperature change per unit charge current density due to the anomalous Ettingshausen effect in the amorphous $Sm_pCo_{100-p}$ ($0 \leq p \leq 100$) gradient-composition film on an MgO substrate. In the region of 0 at %<Sm≤40 at %, when a current is caused to flow, heat flow was generated in a direction perpendicular to both the current and magnetization, and a temperature change was observed. In particular, in the region of Sm=15 to 35 at %, a large temperature change was observed, and the temperature change is maximum in the range of 20 to 30 at %. The alloy composition range suitable for thermoelectric applications only needs to be $0 < p \leq 50$, which exhibits at least a large anomalous Nernst effect. However, from the above results, the range of $0 < p \leq 40$, which indicates the presence of a sufficiently large anomalous Nernst effect, is favorable, the range of $15 \leq p \leq 35$ is more favorable, and the range of $20 \leq p \leq 30$ is still more favorable, on the basis of the reciprocal relationship between the anomalous Ettingshausen effect and the anomalous Nernst effect Next, a thermoelectric body that includes an amorphous $Sm_{20}Co_{80}$ film was prepared as an amorphous $Sm_pCo_{100-p}$ ($0 < p \leq 50$) film in a favorable composition range, and the thermoelectric performance thereof was evaluated.

(Evaluation of Thermoelectric Performance of Amorphous $Sm_{20}Co_{80}$ Film)

Figure 4A:
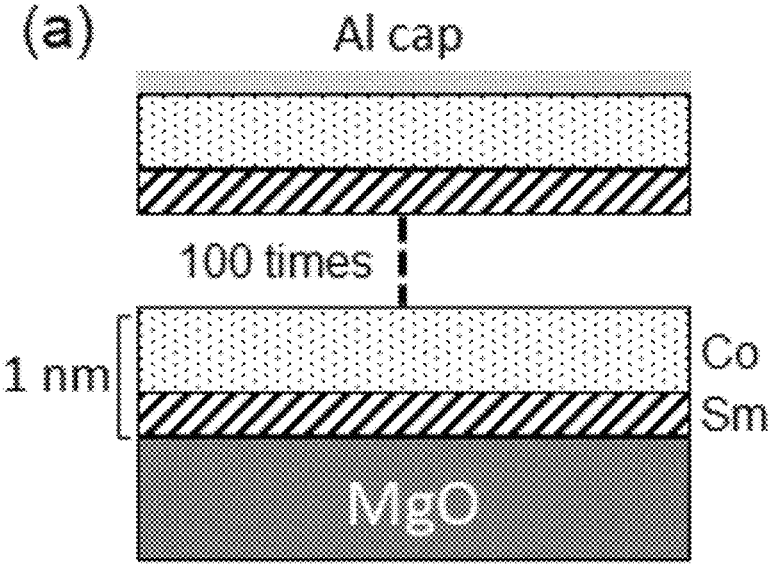
[Fig. 4] Part (a) of FIG. 4 is a schematic cross-sectional view showing a stacked structure for preparing an amorphous $Sm_{20}Co_{80}$ film.

FIG. 4(a) is a schematic cross-sectional view showing a stacked state of an amorphous $Sm_{20}Co_{80}$ film. One hundred stacked bodies with a total thickness of 1 nm of an Sm layer and a Co layer per layer are stacked on an MgO substrate, and aluminum is deposited on the top layer as a cap layer.

Figure 4B:
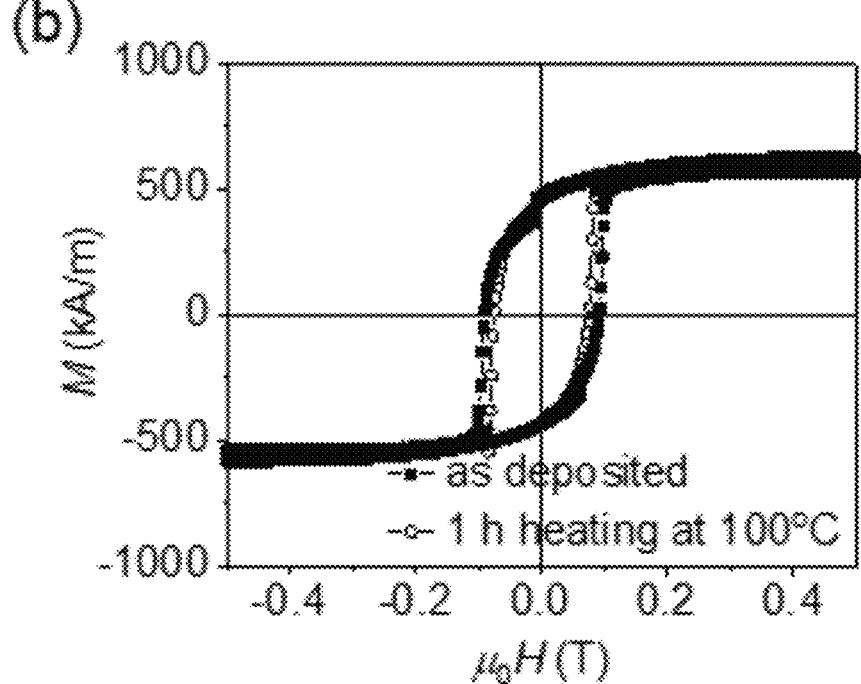

FIG. 4(b) is a diagram showing the magnetic field dependence curve (black data points) of the in-plane magnetization of the deposited amorphous $Sm_{20}Co_{80}$ film. From FIG. 4(b), it can be seen that the amorphous $Sm_{20}Co_{80}$ film exhibits large coercive force and a large ratio of residual magnetization to saturation magnetization when applying a magnetic field in the plane. Further, the magnetic field dependence curve (white data points) of the in-plane magnetization after the same film is heated to 100° C. for 1 hour at an atmospheric pressure is also shown. The substantially overlapping magnetization process corroborates the stability of these alloys.

Figure 4C:
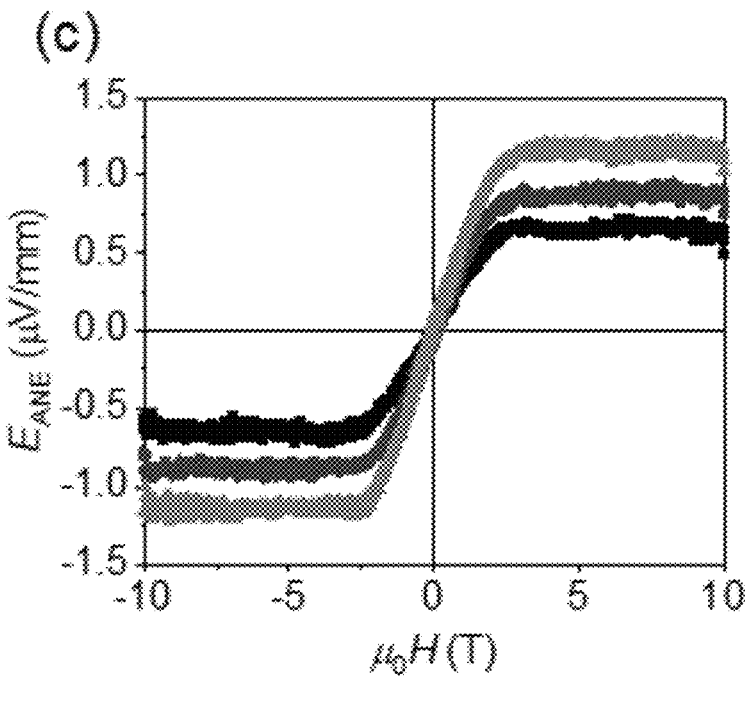
Figure 4D:
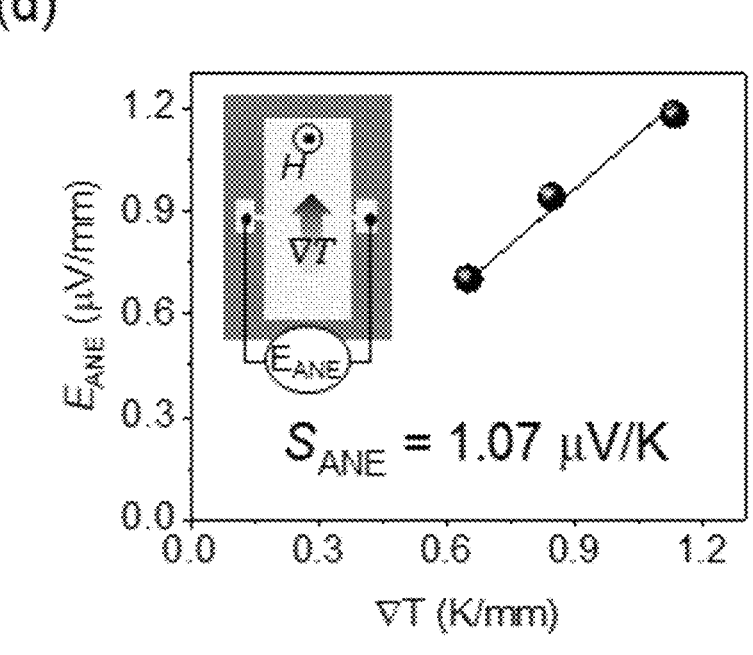

FIG. 4(c) is a diagram showing the external magnetic field dependence of the ANE electric field when the heat output is changed. In the case where heat flow is applied in a direction perpendicular to the plane to magnetize in the in-plane direction as in actual usage, quantification is difficult because there is a temperature gradient in the thickness direction of the film. In FIGS. 4(c) and 4(d), in order to quantitatively measure the temperature gradient, the amorphous $Sm_{20}Co_{80}$ film was magnetized by applying a magnetic field to a direction perpendicular to the film plane, creating a temperature gradient in the in-plane direction. Since the quantification of the in-plane temperature gradient is easy and the electron transport properties of the $Sm_{20}Co_{80}$ film exhibits isotropic properties because it is amorphous, the anomalous Nernst coefficient can be estimated with this arrangement. From FIG. 4(c), it can be seen that the ANE electric field exhibits an odd dependence on the magnetic field and an electric field is saturated when the magnetization of the amorphous $Sm_{20}Co_{80}$ film is saturated. Further, the electric field increased as the heat output was increased (in FIG. 4(c), the lightest colored line shows the result in the case where the heat output is high, and the darkest line shows the result in the case where the heat output is low). These behaviors are consistent with ANE. However, since the magnetic field is applied in a direction perpendicular to the film plane, no coercive force or residual magnetization appears.

FIG. 4(d) is a diagram showing the temperature gradient dependence of the ANE electric field. The amorphous $Sm_{20}Co_{80}$ film exhibits an anomalous Nernst coefficient of 1.07 μV/K at the $Sm_{20}Co_{80}$ composition. As described above, in the thermoelectric body that includes an amorphous $Sm_pCo_{100-p}$ ($0 < p \leq 50$) film according to the present invention, thermoelectric power by a relatively high anomalous Nernst effect can be achieved.

Next, thermoelectric performance when the prepared thermoelectric body that includes an amorphous $Sm_{20}Co_{80}$ film was used in a thermopile for heat flux detection (thermoelectric generation element 10) was evaluated.

(Evaluation of Thermoelectric Performance of Thermopile for Heat Flux Detection)

Figure 5A:
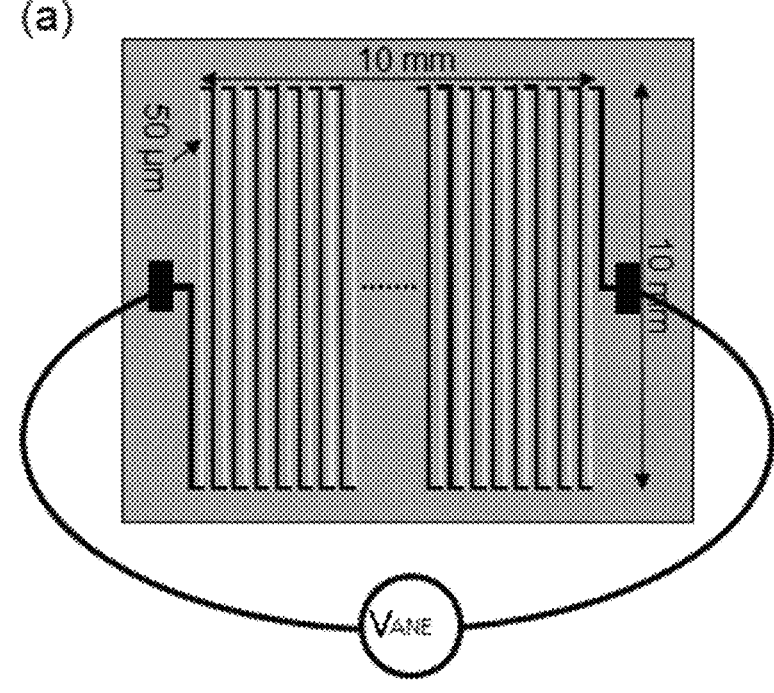

FIG. 5(a) is a diagram showing a schematic structure of a thermopile for heat flux detection using an amorphous $Sm_{20}Co_{80}$ thin film, and is similar to that shown in FIG. 1(a).

Figure 5B:
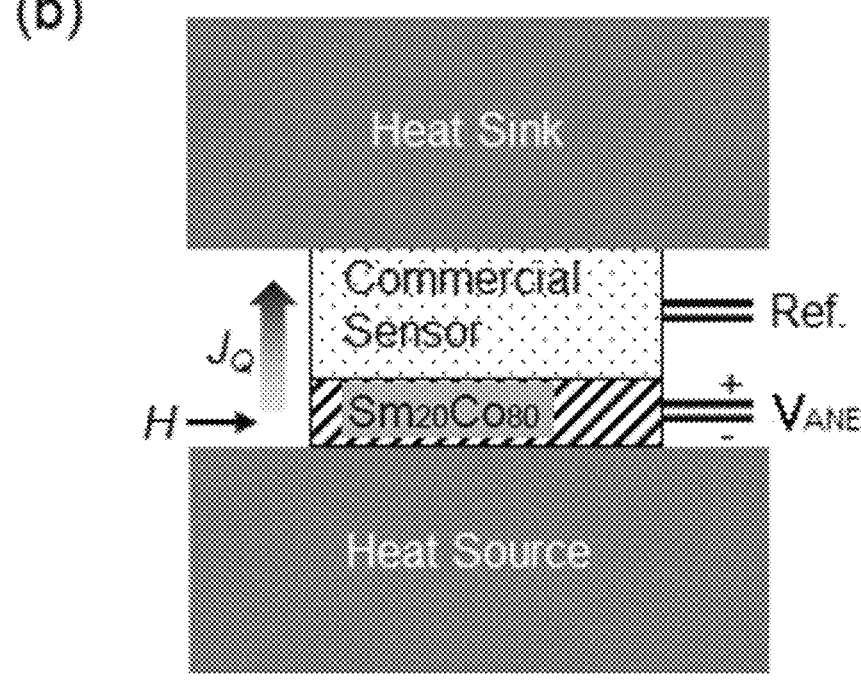

FIG. 5(b) is a diagram showing a schematic experimental apparatus for heat flux sensing. An amorphous $Sm_{20}Co_{80}$ thin film and a heat flow sensor are stacked between a heat source and a heat sink.

Figure 5C:
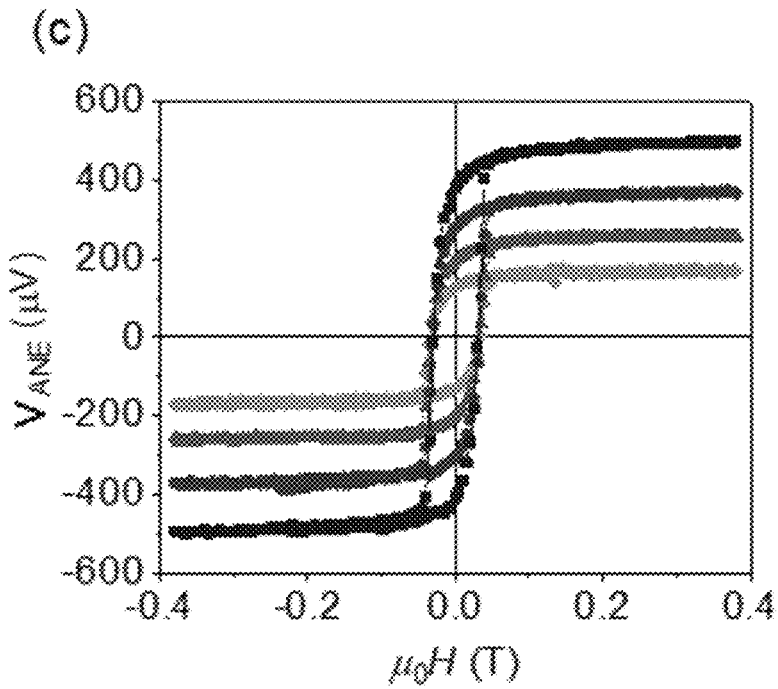

FIG. 5(c) is a diagram showing observation results of the ANE voltage signal using the above experimental configuration of an amorphous $Sm_{20}Co_{80}$ film deposited on a PEN substrate, and the horizontal axis indicates a strength H of the magnetic field to be applied in the in-plane direction. As shown in FIG. 5(c), a signal exhibiting an odd dependence on the magnetic field, which is a characteristic of the ANE electric field, is obtained, and the results reflect large coercive force and residual magnetization of the amorphous $Sm_{20}Co_{80}$ film because a magnetic field is applied in the in-plane direction. That is, a finite ANE electric field is observed in in the zero magnetic field.

Figure 5D:
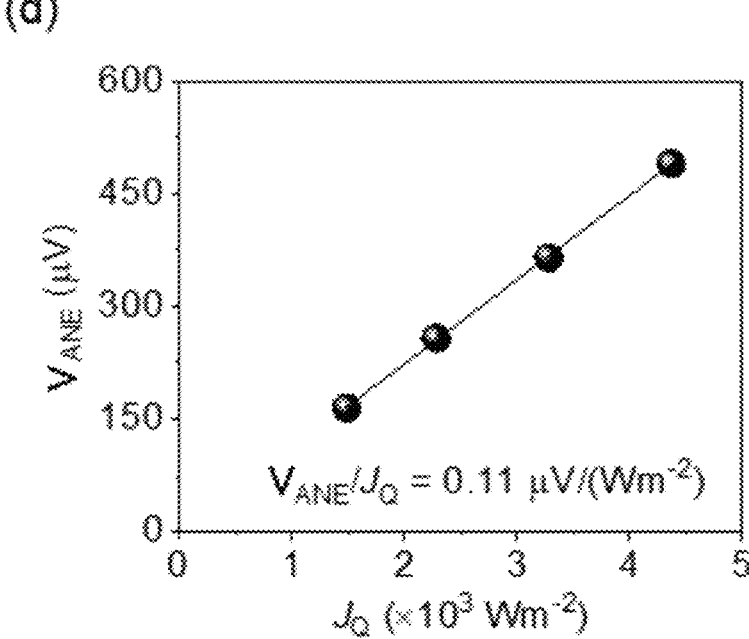

FIG. 5(d) is a diagram showing observation results of the ANE voltage signal using the above experimental configuration of an amorphous $Sm_{20}Co_{80}$ film deposited on a PEN substrate, and the horizontal axis indicates the heat flow density $J_Q$ in a direction perpendicular to the sample plane. By narrowing the width of the wire of each thermoelectric body and the interval between adjacent wires, it is possible to increase the output voltage. FIG. 5(d) shows that an output voltage $V_{ANE}$ increases in proportion to the heat flow density $J_Q$, and $V_{ANE}/J_Q$ represents the sensitivity of the heat flow sensor. As a result, it was found that a heat flow sensor that has favorable sensitivity and operates in a zero magnetic field could be obtained.

Further, in order to examine the optimal composition ratio of $Sm_p(Fe_qCo_{100-q})_{100-p}$, a film that contains an amorphous gradient-composition material in which p of $Sm_p(Fe_q Co_{100-q})_{100-p}$ was 20 and q was changed from 0 to 100 (hereinafter, referred to simply also as an "amorphous $Sm_{20}$ $(Fe_qCo_{100-q})_{80}$ gradient-composition film") was prepared as a rare earth intermetallic amorphous magnetic alloy and the physical properties (structure and thermoelectric performance) thereof were evaluated.

(Amorphous $Sm_{20}(Fe_qCo_{100-q})_{80}$ ($0 \leq q \leq 100$) Gradient-Composition Film and its Structure)

Figure 6A:
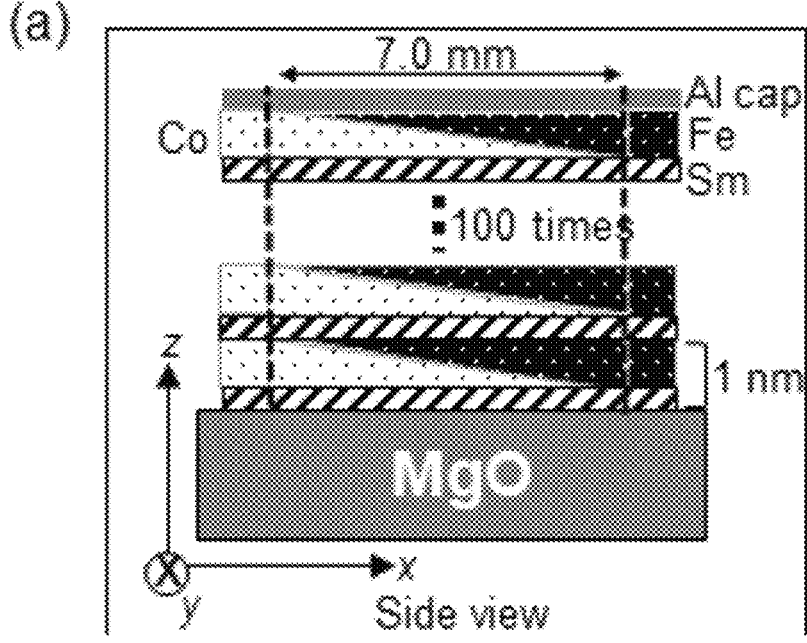

FIG. 6(a) is a schematic cross-sectional view showing a stacked state of an amorphous $Sm_{20}(Fe_qCo_{100-q})_{80}$ ($0 \leq q \leq 100$) gradient-composition film, showing an example of the present invention. One hundred stacked bodies each including an Sm layer and a gradient-composition layer are stacked on an MgO substrate, the Sm layer having a thickness of 0.37 nm, the gradient-composition layer being formed of a gradient-composition material of Fe and Co and having a thickness of 0.63 nm, each stacked body being stacked and having a total thickness of 1 nm, and a thin aluminum film for oxidation prevention is deposited on the top layer thereof. Note that in reality, the composition ratio of the amorphous $Sm_{20}(Fe_qCo_{100-q})_{80}$ ($0 \leq q \leq 100$) gradient-composition film changed from $Sm_{20}Co_{80}$ to $Sm_{17}Fe_{83}$ due to manufacturing errors.

Figure 6B:
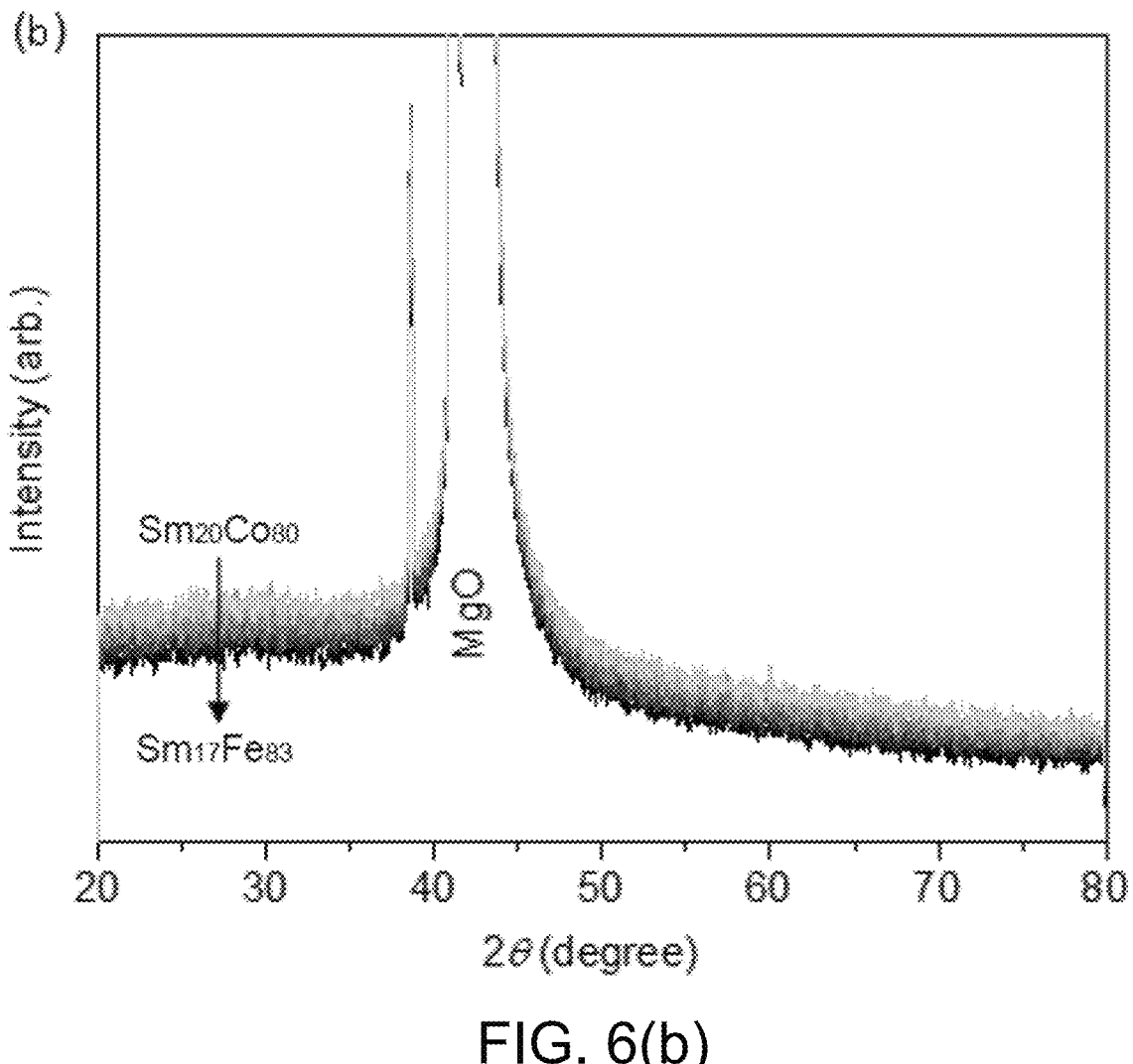

FIG. 6(b) shows an XRD pattern of an amorphous $Sm_{20}$ $(Fe_qCo_{100-q})_{80}$ ($0 \leq q \leq 100$) gradient-composition film at different q values. The XRD pattern at different q values confirmed that all compositions were in an amorphous phase.

Figure 6C:
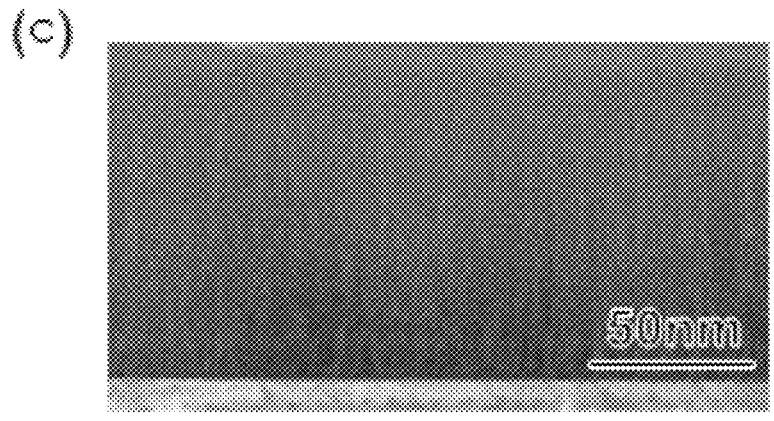

FIG. 6(c) shows a cross-sectional bright field (BF)-STEM image for checking the results obtained by XRD shown in FIG. 6(b).

Figure 6D:
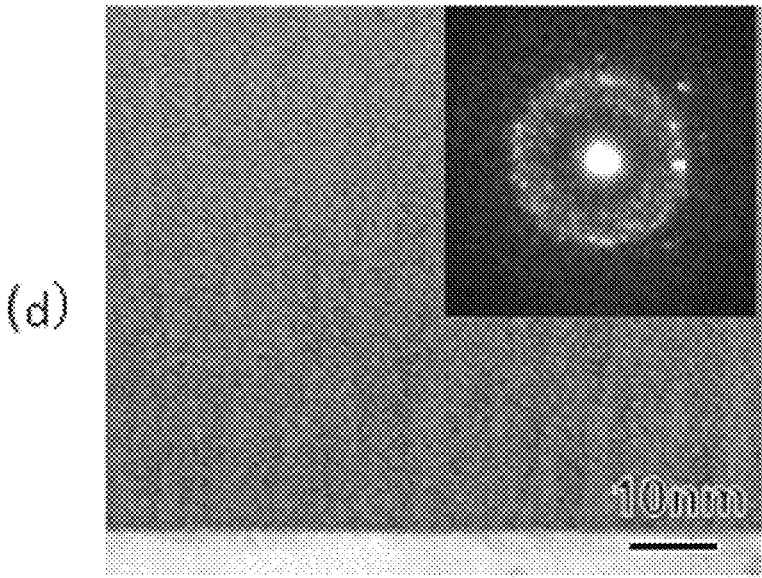

FIG. 6(d) shows a microbeam electron diffraction pattern for checking the results obtained by XRD shown in FIG. 6(b).

It was also confirmed that from FIG. 6(c) and FIG. 6(d), all of the amorphous $Sm_{20}(Fe_qCo_{100-q})_{80}$ ($0 \leq q \leq 100$) gradient-composition film was in an amorphous phase.

(Amorphous $Sm_{20}(Fe_qCo_{100-q})_{80}$ ($0 \leq q \leq 100$) Gradient-Composition Film and its Thermoelectric Effect)

FIG. 7 shows the composition dependence of a temperature change per unit current density by the anomalous Ettingshausen effect in an amorphous $Sm_{20}(Fe_qCo_{100-q})_{80}$ ($0 \leq q \leq 100$) gradient-composition film on an MgO substrate. In the region of 0 at %$\leq$Fe$\leq$90 at %, when a current is caused to flow, heat flow is generated in a direction perpendicular to both the current and magnetization, and a temperature change is observed. Particularly, in the region of Fe=5 to 45 at %, a large temperature change is observed and is maximum in the range of 10 to 35 at %. The alloy composition range suitable for thermoelectric applications only needs to be $0 \leq q \leq 100$, which exhibits at least a large anomalous Nernst effect. However, from the above results, the range of $0 \leq q \leq 90$, which indicates the presence of a sufficiently large anomalous Nernst effect, is favorable, the range of $5 \leq q \leq 45$ is more favorable, and the range of $10 \leq q \leq 35$ is still more favorable, on the basis of the reciprocal relationship between the anomalous Ettingshausen effect and the anomalous Nernst effect.

Next, an amorphous $Sm_{20}(Fe_{23}Co_{77})_{80}$ film (thermoelectric body) was prepared as an amorphous $Sm_{20}(Fe_q Co_{100-q})_{80}$ ($0 \leq q \leq 100$) film included in a favorable composition range, and thermoelectric performance of a thermoelectric generation element using this was evaluated.

(Evaluation of Thermoelectric Performance of Amorphous $Sm_{20}(Fe_{23}Co_{77})_{80}$ Film)

Figure 8A:
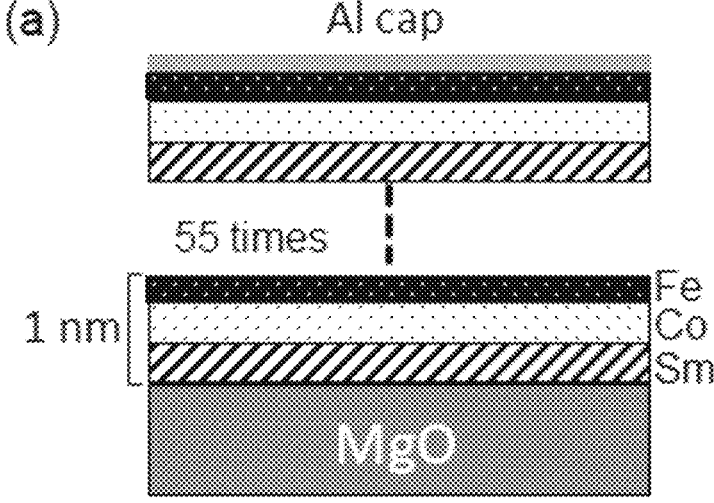

FIG. 8(a) shows a schematic diagram of a process of producing an amorphous $Sm_{20}(Fe_{23}Co_{77})_{80}$ film.

Figure 8B:
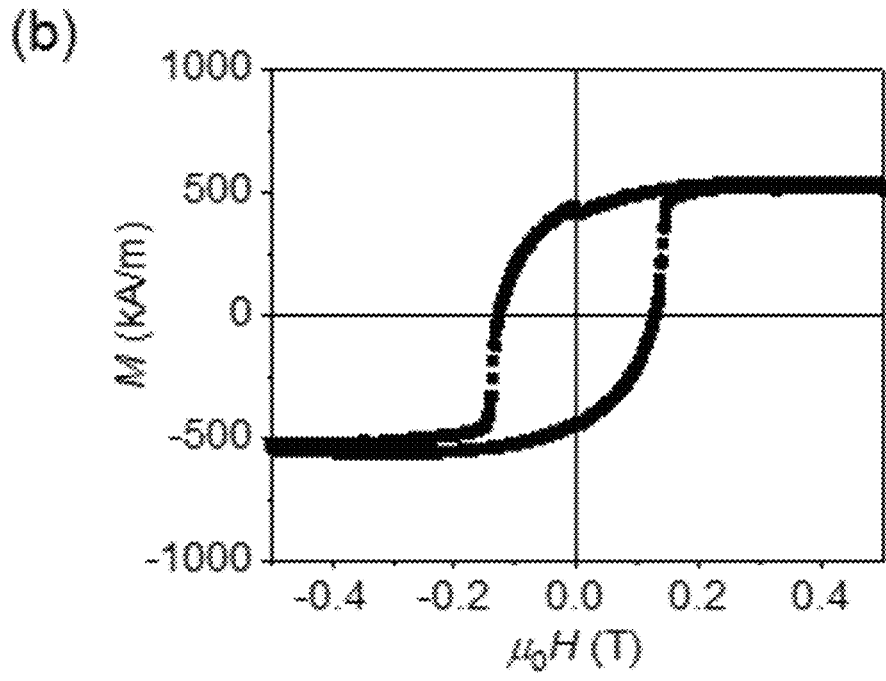

FIG. 8(b) shows the magnetic field dependence curve of the in-plane magnetization of the deposited $Sm_{20}(Fe_{23} Co_{77})_{80}$ film. From FIG. 8(b), it can be seen that the $Sm_{20}(Fe_{23}Co_{77})_{80}$ film also exhibits large coercive force and a large ratio of residual magnetization to saturation magnetization when applying a magnetic field in the plane.

Figure 8C:
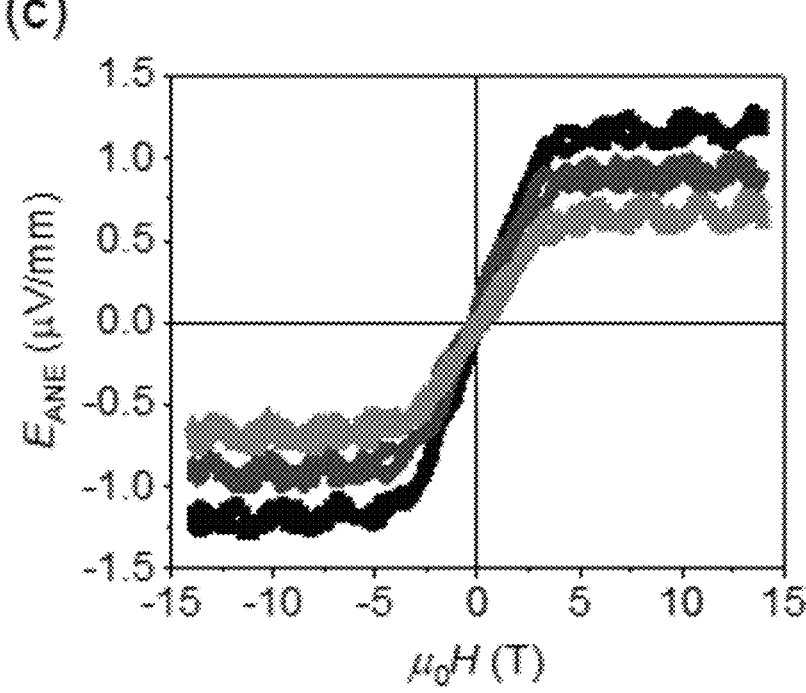

FIG. 8(c) shows the external magnetic field dependence of the ANE voltage when the heat output is changed. In the experiment shown in FIGS. 8(c) and 8(d), a magnetic field was applied in a direction perpendicular to the film plane, creating a temperature gradient in the in-plane direction. The reason thereof is similar to that of FIGS. 4(c) and 4(d). From FIG. 8(c), it can be seen that the ANE electric field exhibits an odd dependence on the magnetic field, and an electric field is saturated when the magnetization of the amorphous $Sm_{20}(Fe_{23}Co_{77})_{80}$ film is saturated. Further, when the heat output is increased, the electric field increased (In FIG. 8(c), the darkest line shows the result in the case where the heat output is high, and the lightest colored line shows the result in the case where the heat output is low). These behaviors are consistent with ANE. However, since the magnetic field is applied in a direction perpendicular to the film plane, no coercive force or residual magnetization appears.

Figure 8D:
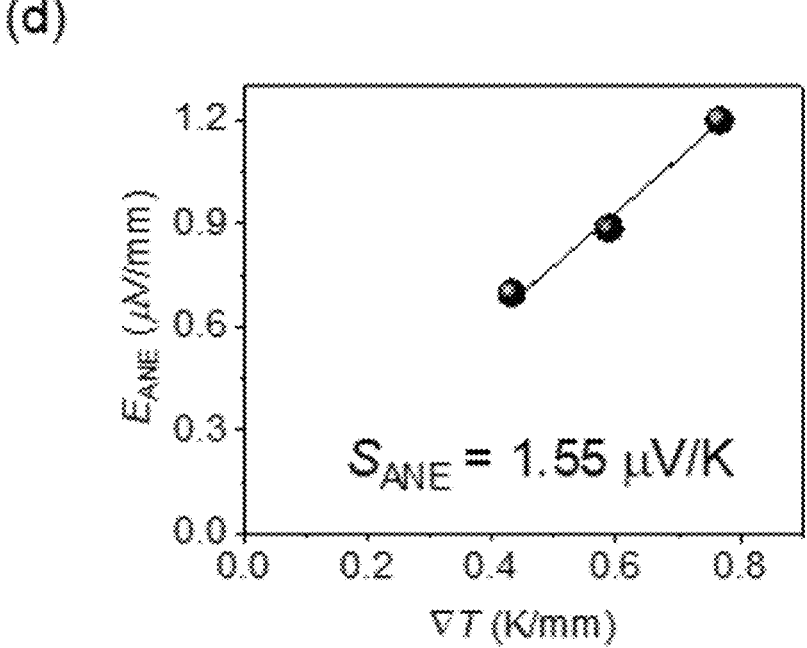

FIG. 8(d) shows the temperature gradient dependence of the ANE voltage. The anomalous Nernst coefficient of a thin film having a $Sm_{20}(Fe_{23}Co_{77})_{80}$ composition is 1.55 μV/K. From the above, it was found that high thermoelectric power could be achieved in a thermoelectric body that includes an amorphous $Sm_p(Fe_qCo_{100-q})_{100-p}$ ($0<p\leq50$, $0\leq q\leq100$) film according to the present invention.

Second Embodiment

Figure 9A:
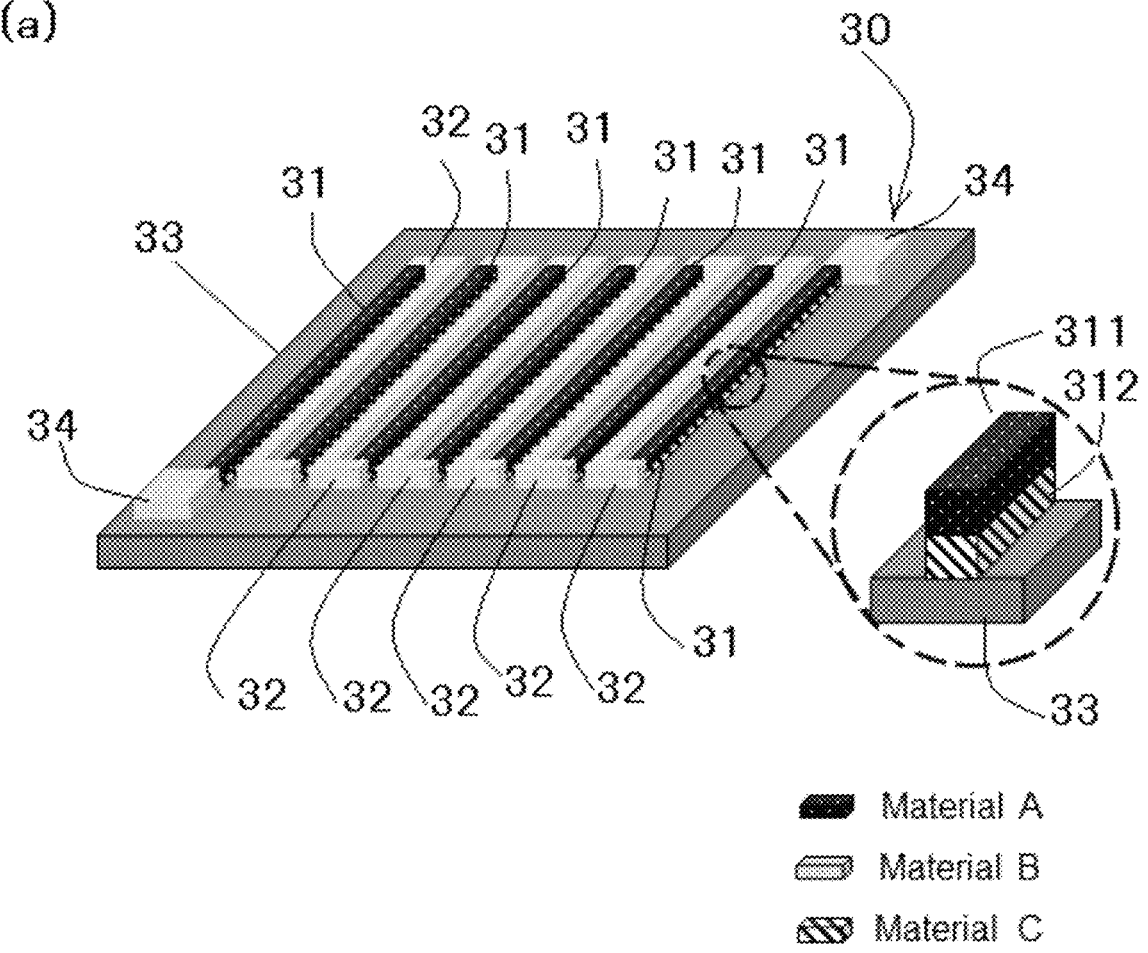
Figure 9B:
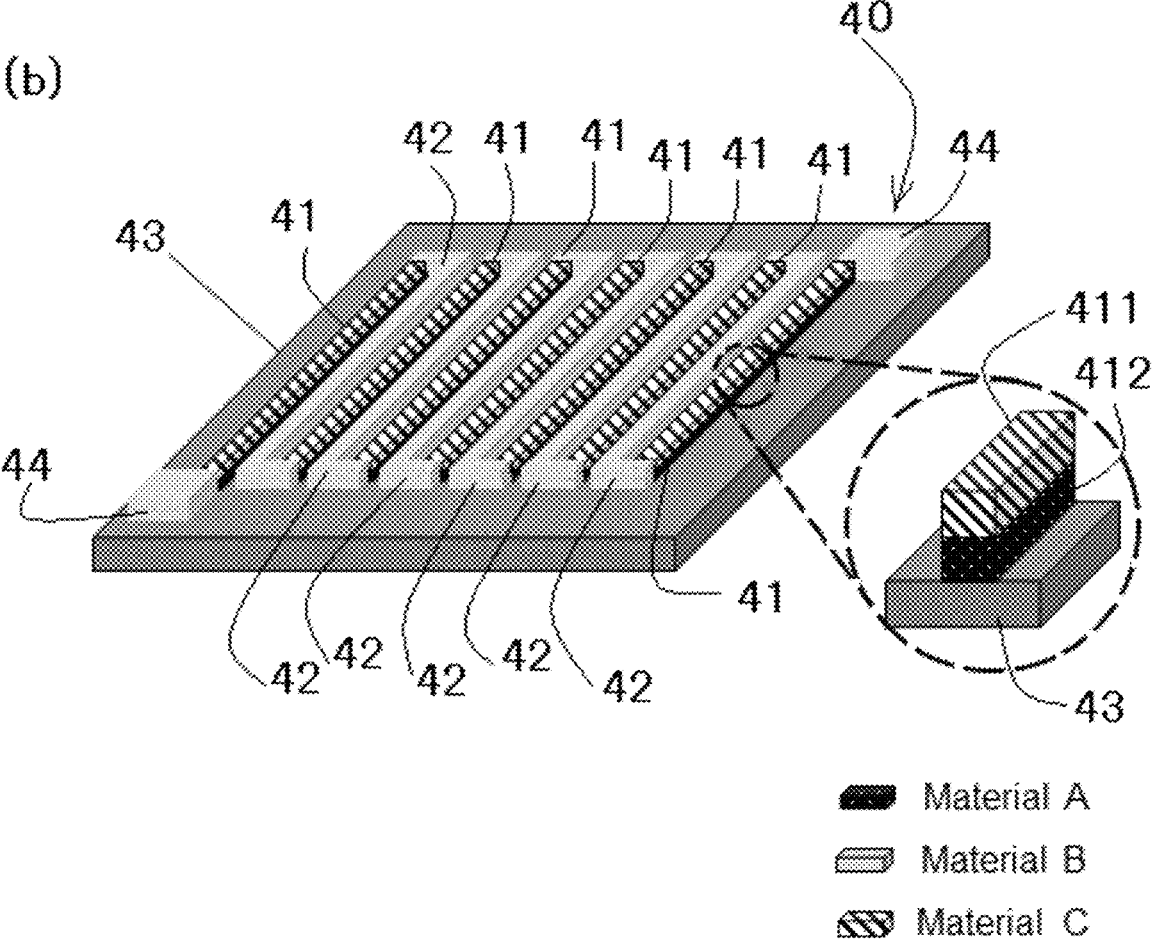

FIGS. 9(a) and 9(b) show a schematic multilayer thermopile structure using the present material and another magnetic material having a huge anomalous Nernst effect, showing a second embodiment of the present invention.

FIG. 9(a) is a diagram describing a multilayer thermoelectric generation element 30 using a thermoelectric conversion material according to the present invention. The multilayer thermoelectric generation element 30 shown in FIG. 9(a) includes a substrate 33, a multilayer thermoelectric body 31 and a connector 32 arranged on this substrate 33, and a connection terminal 34.

The multilayer thermoelectric body 31 has a stacked structure that includes a first magnetic material layer 311 formed of a rare earth intermetallic amorphous magnetic alloy that is the same material as that of the thermoelectric body 11, and a second magnetic material layer 312 formed of a magnetic material having an anomalous Nernst effect, which is different from the rare earth intermetallic amorphous magnetic alloy forming the thermoelectric body 11.

The first magnetic material layer 311 exhibits a large anomalous Nernst effect. The anomalous Nernst coefficient (thermoelectric power) of the first magnetic material layer 311 is favorably 1 μV/K or more, and the anomalous Nernst coefficient does not necessarily need to be huge. Since the first magnetic material layer 311 has strong magnetic anisotropy in the in-plane direction of the thin film, it has an easy axis of magnetization that exhibits a large coercive force and a large ratio of residual magnetization with respect to the in-plane magnetic field. For this reason, the first magnetic material layer 311 is capable of generating thermoelectromotive force in the zero magnetic field. In such a first magnetic material layer 311, the coercive force is favorably 10 mT or more, and the ratio of residual magnetization is favorably 0.3 or more.

The second magnetic material layer 312 is formed of a magnetic material that exhibits a huge anomalous Nernst effect and has a huge anomalous Nernst coefficient. The anomalous Nernst coefficient (thermoelectric power) of the second magnetic material layer 312 is larger than the anomalous Nernst coefficient (thermoelectric power) of the first magnetic material layer 311, and is favorably 5 μV/K or more, for example. Since the second magnetic material layer 312 has weak magnetic anisotropy in the in-plane direction, the residual magnetization significantly decreases when the second magnetic material layer 312 alone is thickened or thinned. For this reason, the second magnetic material layer 312 does not operate in the zero magnetic field.

In this regard, when both the first magnetic material layer 311 formed of a rare earth intermetallic amorphous magnetic alloy and the second magnetic material layer 312 are bonded to each other, the second magnetic material layer 312 exhibiting a huge anomalous Nernst coefficient can be magnetized in one direction even in the zero magnetic field due to exchange coupling, it is possible to achieve both the zero magnetic field operation and a large anomalous Nernst coefficient. Examples of the magnetic material of the second magnetic material layer 312 include an Fe—Ga alloy, an Fe—Al alloy, a Heusler alloy such as $Co_2MnGa$, and an antiferromagnetic material such as $YbMnBi_2$.

Further, the same material as that of the connector 12 is used for the connector 32, but a rare earth intermetallic amorphous magnetic alloy such as $Sm_pCo_{100-p}$ ($0<p\leq50$)

may be used. If the magnetization direction of the connector 32 can be directed to be opposed to the magnetization direction of the multilayer thermoelectric body 31, the connector 32 may include the same stacked body as that of the multilayer thermoelectric body 31. Note that the arrangement of the multilayer thermoelectric body 31 and the connector 32 may be exchanged.

Meanwhile, the same material as that of the substrate 13 is used for the substrate 33.

The connection terminals 34 are formed of the same material as that of the connector 32 here, and are provided at both ends of the multilayer thermoelectric body 31. The connection terminal 34 may include the same stacked body as that of the multilayer thermoelectric body 31.

Note that in FIG. 9(a), the material of the first magnetic material layer 311 is indicated as the Material A, the material of the second magnetic material layer 312 is indicated as a Material C, and the material of the connector 32 is indicated as the Material B.

The multilayer thermoelectric body 31 is formed by making a film formed of a rare earth intermetallic amorphous magnetic alloy such as amorphous $Sm_{20}Co_{80}$ and a magnetic material different from this, which is deposited on the substrate 33, into a thin wire. In this regard, the apparatus shown in FIG. 9(a) is magnetized in the same direction as that shown in FIG. 1(a). In this regard, the multilayer thermoelectric body 31 is configured to generate electricity in the direction of the electric field shown in FIG. 1(a) (longitudinal direction of the multilayer thermoelectric body 31 and the connector 32) with respect to the temperature difference in a direction (direction of heat flow shown in FIG. 1(a)) perpendicular to the direction of magnetization by the anomalous Nernst effect.

The connectors 32 are arranged on the surface of the substrate 33 in parallel to the multilayer thermoelectric bodies 31, 31, . . . . One connector 32 is arranged between a pair of multilayer thermoelectric bodies 31, 31 adjacent to each other, and the connector 32 electrically connects one end side of one multilayer thermoelectric body 31 and the other end side of the other multilayer thermoelectric body 31. As a result, the multilayer thermoelectric bodies 31 are electrically connected in series by the connectors 32.

As described above, the multilayer thermoelectric generation element 30 includes the multilayer thermoelectric body 31 formed of a rare earth intermetallic amorphous magnetic alloy such as amorphous $Sm_{20}Co_{80}$ and a magnetic material different from this. In accordance with the multilayer thermoelectric body 31 formed of a rare earth intermetallic amorphous magnetic alloy such as amorphous $Sm_{20}Co_{80}$ and a magnetic material different from this, it is possible to increase the thermoelectromotive force by increasing the effective length in the electric field direction. Therefore, in accordance with this embodiment, it is possible to provide the multilayer thermoelectric generation element 30 that is easy to put to practical use, by using such a multilayer thermoelectric body 31.

FIG. 9(b) is a diagram describing a multilayer thermoelectric generation element 40 using a thermoelectric conversion material according to the present invention. The multilayer thermoelectric generation element 40 shown in FIG. 9(b) includes a substrate 43, a multilayer thermoelectric body 41 and a connector 42 arranged on this substrate 43, and a connection terminal 44.

The multilayer thermoelectric body 41 includes a first magnetic material layer 412 formed of the same material as that of the thermoelectric body 11, and a second magnetic material layer 411 formed of a magnetic material that is different from that of the thermoelectric body 11 and has a huge anomalous Nernst effect. In the example shown in FIG. 9(*b*), the stacking order of the first magnetic material layer 412 and the second magnetic material layer 411 is reversed as compared with the example shown in FIG. 9(*a*).

The same material as that of the connector 32 is used for the connector 42. The same material as that of the substrate 13 is used for the substrate 43. The connection terminal 44 are formed of the same material as that of the connector 42 here, and are provided at both ends of the multilayer thermoelectric body 41. The connection terminal 44 may include the same stacked body as that of the multilayer thermoelectric body 41.

The connectors 42 are arranged on the surface of the substrate 43 in parallel to the multilayer thermoelectric bodies 41, 41, . . . . One connector 42 is arranged between a pair of multilayer thermoelectric bodies 41, 41 adjacent to each other, and the connector 42 electrically connects one end side of one thermoelectric body 41 and the other end side of the other thermoelectric body 41. As a result, the multilayer thermoelectric bodies 41 are electrically connected in series by the connectors 42.

As described above, the multilayer thermoelectric generation element 40 includes the multilayer thermoelectric body 41 formed of a rare earth intermetallic amorphous magnetic alloy such as amorphous $Sm_{20}Co_{80}$ and a magnetic material different from this. In accordance with the multilayer thermoelectric body 41 formed of amorphous $Sm_{20}Co_{80}$ and a magnetic material different from this, it is possible to increase the thermoelectromotive force by increasing the effective length in the electric field direction. Therefore, in accordance with this embodiment, it is possible to provide the multilayer thermoelectric generation element 40 that is easy to put to practical use, by using such a multilayer thermoelectric body 41.

Since materials such as the rare earth intermetallic amorphous magnetic alloy used for the multilayer thermoelectric bodies 31, 41 and the connectors 32, 42 and the magnetic material different from this exhibit finite coercive force and residual magnetization, it is possible to individually control the magnetization direction of each wire, and realize a thermopile element formed of a single material. The magnetization of each layer can be controlled by utilizing a local magnetic field or an exchange bias effect by adding a pinning layer such as Cr.

INDUSTRIAL APPLICABILITY

The thermoelectric body according to the present invention is capable of increasing thermoelectromotive force by connecting magnetic materials exhibiting the anomalous Nernst effect and connectors in a zigzag pattern to increase the effective length in the electric field direction, and is suitable for use in a thermoelectric generation element utilizing the anomalous Nernst effect.

In accordance with the thermoelectric body according to the present invention, a rare earth intermetallic amorphous magnetic alloy that can be produced on any type of substrate including a flexible substrate using a magnetron sputtering method, a vapor deposition method, or the like at room temperature is used. For this reason, it can be used universally in various types of thermopile structures. The thermoelectric body according to the present invention can be used for realizing a bendable thermoelectric generator and a bendable heat flow sensor.

The multilayer thermoelectric body according to the present invention is capable of increasing thermoelectromotive force by connecting magnetic materials exhibiting the anomalous Nernst effect and second magnetic material layers in a zigzag pattern to increase the effective length in the electric field direction, and is suitable for use in a thermoelectric generation element and a heat flow sensor utilizing the anomalous Nernst effect.

REFERENCE SIGNS LIST

10, 20 thermoelectric generation element
11, 21 thermoelectric body
12 connector
13, 23 substrate
14, 24 terminal
22 reverse magnetization connector
30, 40 multilayer thermoelectric generation element
31, 41 multilayer thermoelectric body
311, 412 first magnetic material layer
312, 411 second magnetic material layer
32, 42 connector
33, 43 substrate
34, 44 terminal

The invention claimed is:

1. A thermoelectric body that is a film of magnetic alloy wires for use in a thermoelectric generation element utilizing an anomalous Nernst effect, the thermoelectric body having an amorphous structure and an easy axis of magnetization that lies in a plane of the film of magnetic alloy wires, wherein the film of magnetic alloy wires is formed of:

$Sm_p(Fe_qCo_{100-q})_{100-p}$, and wherein in the $Sm_p(Fe_qCo_{100-q})_{100-p}$, relationships of $15 \leq p \leq 35$ and $5 \leq q \leq 45$ are satisfied.

2. A thermoelectric generation element, comprising:

a thermoelectric body according to claim 1, and a substrate that supports the thermoelectric body.

3. A multilayer thermoelectric body, having a stacked film of magnetic alloy wires comprising:

a first magnetic material layer that has an easy axis of magnetization exhibiting large coercive force and a large ratio of residual magnetization to saturation magnetization, exhibits a large anomalous Nernst effect, and is formed of a rare earth intermetallic amorphous magnetic alloy, the easy axis of magnetization lying in a plane of the stacked film of magnetic alloy wires, and a second magnetic material layer that exhibits a huge anomalous Nernst effect and is formed of a magnetic material different from the rare earth intermetallic amorphous magnetic alloy material, wherein the rare earth intermetallic amorphous magnetic alloy is formed of:

$Sm_p(Fe_qCo_{100-q})_{100-p}$, and wherein in the $Sm_p(Fe_qCo_{100-q})_{100-p}$, relationships of $15 \leq p \leq 35$ and $5 \leq q \leq 45$ are satisfied.

4. The multilayer thermoelectric body according to claim 3, wherein the large coercive force is coercive force of 10 mT or more, the large ratio of residual magnetization to saturation magnetization is 0.3 or more, the large anomalous Nernst effect is thermoelectric power of 1 µV/K or more, and the huge anomalous Nernst effect thermoelectric power of 5 µV/K or more.

5. A multilayer thermoelectric generation element, comprising:

the multilayer thermoelectric body according to claim 3; and a substrate that supports the thermoelectric body.

6. A bendable thermoelectric generator comprising the thermoelectric generation element according to claim 2.

7. A bendable heat flow sensor comprising the thermoelectric generation element according to claim 2.

8. A bendable thermoelectric generator comprising the multilayer thermoelectric generation element according to claim 5.

9. A bendable heat flow sensor comprising the multilayer thermoelectric generation element according to claim 5.

10. The thermoelectric body according to claim 1, wherein in the $Sm_p(Fe_qCo_{100-q})_{100-p}$, relationships of $20 \leq p \leq 30$ and $10 \leq q \leq 35$ are satisfied.

11. The thermoelectric body according to claim 1, wherein the thermoelectric generation element is configured to operate without an external magnetic field.

12. The thermoelectric generation element according to claim 2, excluding a device configured to apply an external magnetic field.

\* \* \* \* \*